(12) United States Patent
Koike et al.

(10) Patent No.: US 11,938,731 B2
(45) Date of Patent: Mar. 26, 2024

(54) PIEZOELECTRIC DEVICE AND LIQUID EJECTING HEAD

(71) Applicant: Seiko Epson Corporation, Tokyo (JP)

(72) Inventors: Harunobu Koike, Matsumoto (JP); Masao Nakayama, Shiojiri (JP); Toshihiro Shimizu, Fujimi-machi (JP); Yasushi Yamazaki, Azumino (JP); Osamu Tonomura, Ebina (JP); Tatsuo Sawasaki, Fujimi-machi (JP); Chihiro Nishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/656,768

(22) Filed: Mar. 28, 2022

(65) Prior Publication Data

US 2022/0314621 A1 Oct. 6, 2022

(30) Foreign Application Priority Data

Mar. 30, 2021 (JP) ................................ 2021-058178

(51) Int. Cl.
*B41J 2/14* (2006.01)
*H10N 30/20* (2023.01)
*H10N 30/853* (2023.01)

(52) U.S. Cl.
CPC ...... *B41J 2/14233* (2013.01); *H10N 30/2047* (2023.02); *H10N 30/8554* (2023.02)

(58) Field of Classification Search
None
See application file for complete search history.

(56) References Cited

U.S. PATENT DOCUMENTS

| | | | |
|---|---|---|---|
| 2010/0231658 A1* | 9/2010 | Shimada | B41J 2/14233 347/68 |
| 2014/0267508 A1* | 9/2014 | Ohashi | B41J 2/1645 310/330 |
| 2019/0232657 A1* | 8/2019 | Takabe | H10N 30/2047 |

FOREIGN PATENT DOCUMENTS

JP 2008-078407 4/2008

* cited by examiner

*Primary Examiner* — Erica S Lin
(74) *Attorney, Agent, or Firm* — WORKMAN NYDEGGER

(57) ABSTRACT

A substrate, a diaphragm, and a piezoelectric actuator are laminated in this order in a first direction, the diaphragm includes a first layer containing silicon as a constituent element, a second layer disposed between the first layer and the piezoelectric actuator, and containing any one or both of at least one metal element selected from the group made of chromium, titanium, aluminum, tantalum, hafnium, and iridium, and silicon nitride, as a constituent element, and a third layer disposed between the second layer and the piezoelectric actuator and containing zirconium as a constituent element, and a fourth layer containing any one or both of at least one metal element selected from the group made of chromium, titanium, aluminum, tantalum, hafnium, and iridium, and silicon nitride, as a constituent element is provided on the third layer on a piezoelectric actuator side.

19 Claims, 16 Drawing Sheets

PIEZOELECTRIC DEVICE AND LIQUID EJECTING HEAD

The present application is based on, and claims priority from JP Application Serial Number 2021-058178, filed Mar. 30, 2021, the disclosure of which is hereby incorporated by reference herein in its entirety.

BACKGROUND

1. Technical Field

The present disclosure relates to a piezoelectric device and a liquid ejecting head having a diaphragm and a piezoelectric actuator provided on a substrate.

2. Related Art

An ink jet recording head is known as a liquid ejecting head, which is one of the electronic devices. The ink jet recording head includes a substrate provided with a pressure chamber communicating with a nozzle, a diaphragm provided on one surface side of the substrate, and a piezoelectric actuator provided on the diaphragm, and causes a pressure change in the ink in the pressure chamber by driving the piezoelectric actuator, and ejects ink droplets from the nozzle. For example, JP-A-2008-78407 discloses a diaphragm having an elastic film made of silicon dioxide and an insulator film made of zirconium oxide. Here, the elastic film is formed by thermally oxidizing one surface of the silicon single crystal substrate. The insulator film is formed by thermally oxidizing a layer of zirconium alone formed on the elastic film by a sputtering method or the like.

When moisture invades the diaphragm, the invaded moisture makes zirconium oxide brittle, causing damage such as delamination and cracks between the elastic film and the insulator film.

In particular, in a high temperature and high humidity environment, moisture invades the inside of the diaphragm from an interface between the elastic film and the insulator film on the end surface of the piezoelectric actuator, an interface between the second electrode and the insulator film on the end surface of the piezoelectric actuator, and a surface of the second electrode opposite to the substrate of the piezoelectric actuator.

SUMMARY

According to an aspect of the present disclosure, there is provided a piezoelectric device including a substrate having a recessed portion, a diaphragm, and a piezoelectric actuator, in which the substrate, the diaphragm, and the piezoelectric actuator are laminated in this order in a first direction, the diaphragm includes a first layer containing silicon as a constituent element, a second layer disposed between the first layer and the piezoelectric actuator, and containing any one or both of at least one metal element selected from the group made of chromium, titanium, aluminum, hafnium, and iridium, and silicon nitride, as a constituent element, and a third layer disposed between the second layer and the piezoelectric actuator and containing zirconium as a constituent element, and a fourth layer is provided, and the fourth layer containing any one or both of at least one metal element selected from the group made of chromium, titanium, aluminum, tantalum, hafnium, and iridium, and silicon nitride, as a constituent element, on the third layer on a piezoelectric actuator side.

In addition, according to another aspect of the present disclosure, there is provided a liquid ejecting head including a piezoelectric actuator, a diaphragm that vibrates by driving the piezoelectric actuator, and a flow path formation substrate provided with a pressure chamber that applies pressure to a liquid by a vibration of the diaphragm, in which the flow path formation substrate, the diaphragm, and the piezoelectric actuator are laminated in this order in a first direction, the diaphragm includes a first layer containing silicon as a constituent element, a second layer disposed between the first layer and the piezoelectric actuator, and containing any one or both of at least one metal element selected from the group made of chromium, titanium, aluminum, tantalum, hafnium, and iridium, and silicon nitride, as a constituent element, and a third layer disposed between the second layer and the piezoelectric actuator and containing zirconium as a constituent element, and the head further includes a fourth layer containing any one or both of at least one metal element selected from the group made of chromium, titanium, aluminum, tantalum, hafnium, and iridium, and silicon nitride, as a constituent element, on the third layer on a piezoelectric actuator side.

Furthermore, according to still another aspect of the present disclosure, there is provided a liquid ejecting apparatus including the liquid ejecting head according to the above aspect.

DESCRIPTION OF EXEMPLARY EMBODIMENTS

Figure 1:
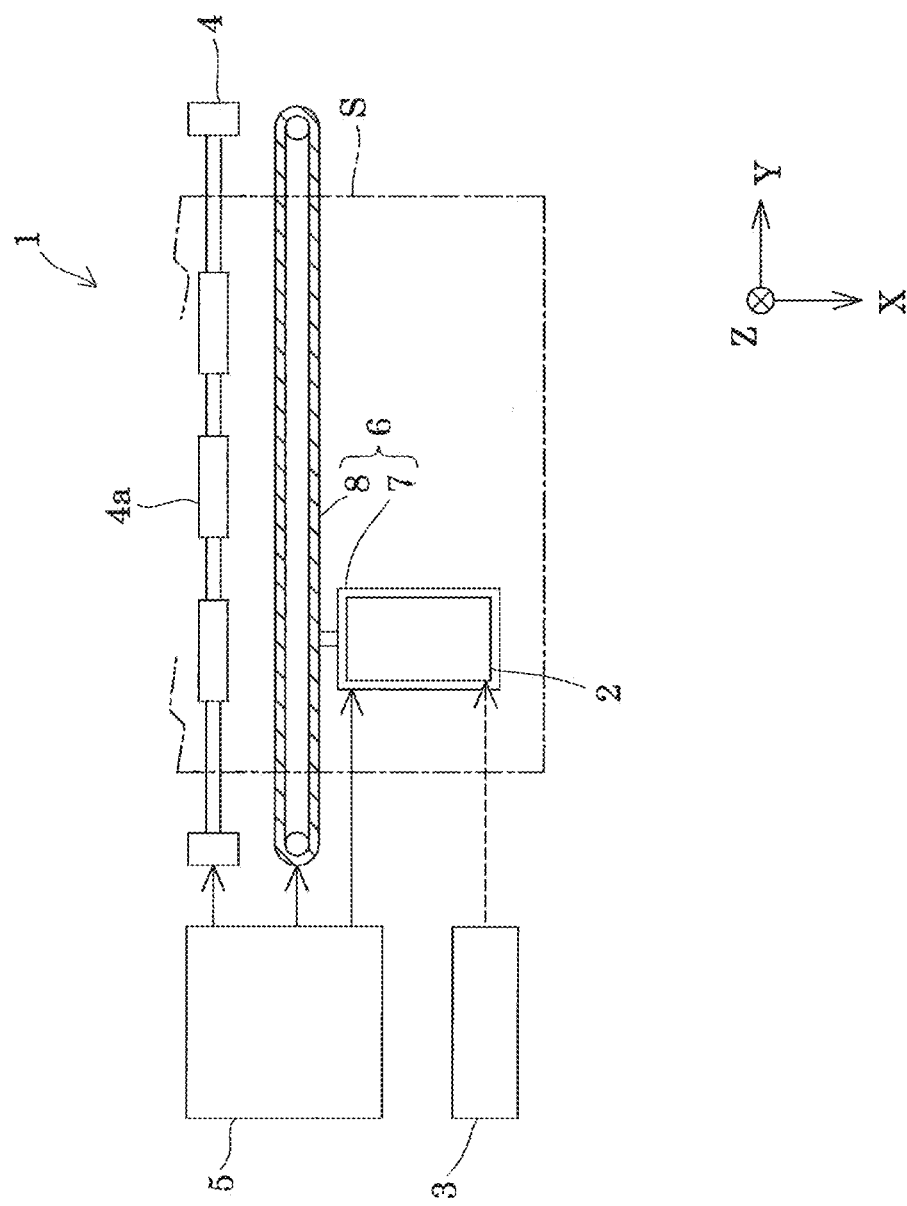
FIG. 1 is a schematic diagram of an ink jet recording device according to Embodiment 1.

Hereinafter, the present disclosure will be described in detail based on embodiments. However, the following description illustrates an aspect of the present disclosure, and can be randomly changed within the scope of the present disclosure. Those having the same reference numerals in each figure indicate the same members, and the description thereof is omitted as appropriate. In addition, in each figure, X, Y, and Z represent three spatial axes that are orthogonal to each other. In the present specification, the directions along these axes are the X direction, the Y direction, and the Z direction. The direction where the arrow in each figure points is the positive (+) direction, and a direction opposite to the arrow is the negative (−) direction. In addition, the three X, Y, and Z spatial axes that do not limit the positive direction and the negative direction will be described as the X axis, the Y axis, and the Z axis. In addition, in each of the following embodiments, as an example, the "first direction" is the −Z direction and the "second direction" is the +Z direction. In addition, viewing in the direction along the Z axis is referred to as "plan view".

Here, typically, the Z axis is a vertical axis, and the +Z direction corresponds to the downward direction in the vertical direction. However, the Z axis may not be a vertical axis. In addition, the X axis, the Y axis, and the Z axis are typically orthogonal to each other, but are not limited thereto, and may intersect at an angle within a range of, for example, 80° or more and 100° or less.

Embodiment 1

FIG. 1 is a diagram schematically illustrating an ink jet recording device 1 which is an example of a liquid ejecting apparatus according to Embodiment 1 of the present disclosure.

As illustrated in FIG. 1, the ink jet recording device 1 which is an example of a liquid ejecting apparatus is a printing device that ejects and lands ink, which is a type of liquid, as ink droplets on a medium S such as printing paper, and prints an image or the like by arranging dots formed on the medium S. As the medium S, any material such as a resin film or cloth can be used in addition to the recording paper.

In the following, among the three spatial axes of X, Y, and Z, the moving direction (in other words, main scanning direction) of a recording head 2 described later is defined as the X axis, the transport direction of the medium S orthogonal to the main scanning direction is defined as the Y axis, a plane parallel to the nozzle surface on which a nozzle 21 (refer to FIG. 2) of the recording head 2 is formed is defined as the XY plane, a nozzle surface, that is, a direction intersecting the XY plane, a direction orthogonal to the XY plane in the present embodiment, is defined as the Z axis, and the ink droplets are ejected in the +Z direction along the Z axis.

The ink jet recording device 1 includes a liquid container 3, a transport mechanism 4 for sending out the medium S, a control unit 5 which is a control portion, a movement mechanism 6, and an ink jet recording head 2 (hereinafter, also simply referred to as a recording head 2).

The liquid container 3 individually stores a plurality of types (for example, a plurality of colors) of ink ejected from the recording head 2. Examples of the liquid container 3 include a cartridge that can be attached to and detached from the ink jet recording device 1, a bag-shaped ink pack made of a flexible film, an ink tank that can be refilled with ink, and the like. In addition, although not particularly illustrated, a plurality of types of inks having different colors and types are stored in the liquid container 3.

Although not particularly illustrated, the control unit 5 includes, for example, a control device such as a central processing unit (CPU) or a field programmable gate array (FPGA) and a storage device such as a semiconductor memory. The control unit 5 comprehensively controls each element of the ink jet recording device 1, that is, the transport mechanism 4, the movement mechanism 6, the recording head 2, and the like by executing a program stored in the storage device by the control device.

The transport mechanism 4 is controlled by the control unit 5 to transport the medium S in the Y direction, and includes, for example, a transport roller 4a. The transport mechanism 4 for transporting the medium S is not limited to the transport roller 4a, and may transport the medium S by a belt or a drum.

The movement mechanism 6 is controlled by the control unit 5 to reciprocate the recording head 2 in the +X direction and the −X direction along the X axis.

Specifically, the movement mechanism 6 of the present embodiment includes a transport body 7 and a transport belt 8. The transport body 7 is a substantially box-shaped structure for accommodating the recording head 2, a so-called carriage, and is fixed to the transport belt 8. The transport belt 8 is an endless belt erected along the X axis. The rotation of the transport belt 8 under the control of the control unit 5 causes the recording head 2 to reciprocate together with the transport body 7 in the +X direction and the −X direction along a guide rail (not illustrated). It is also possible to mount the liquid container 3 on the transport body 7 together with the recording head 2.

Under the control of the control unit 5, the recording head 2 ejects the ink supplied from the liquid container 3 onto the medium S in the +Z direction as ink droplets from each of a plurality of nozzles 21. The ink droplets are ejected from the recording head 2 in parallel with the transport of the medium S by the transport mechanism 4 and the reciprocating movement of the recording head 2 by the movement mechanism 6, so that so-called printing, in which an image with ink is formed on the surface of the medium S, is performed. Here, the recording head 2 is an example of a "piezoelectric device".

Figure 2:
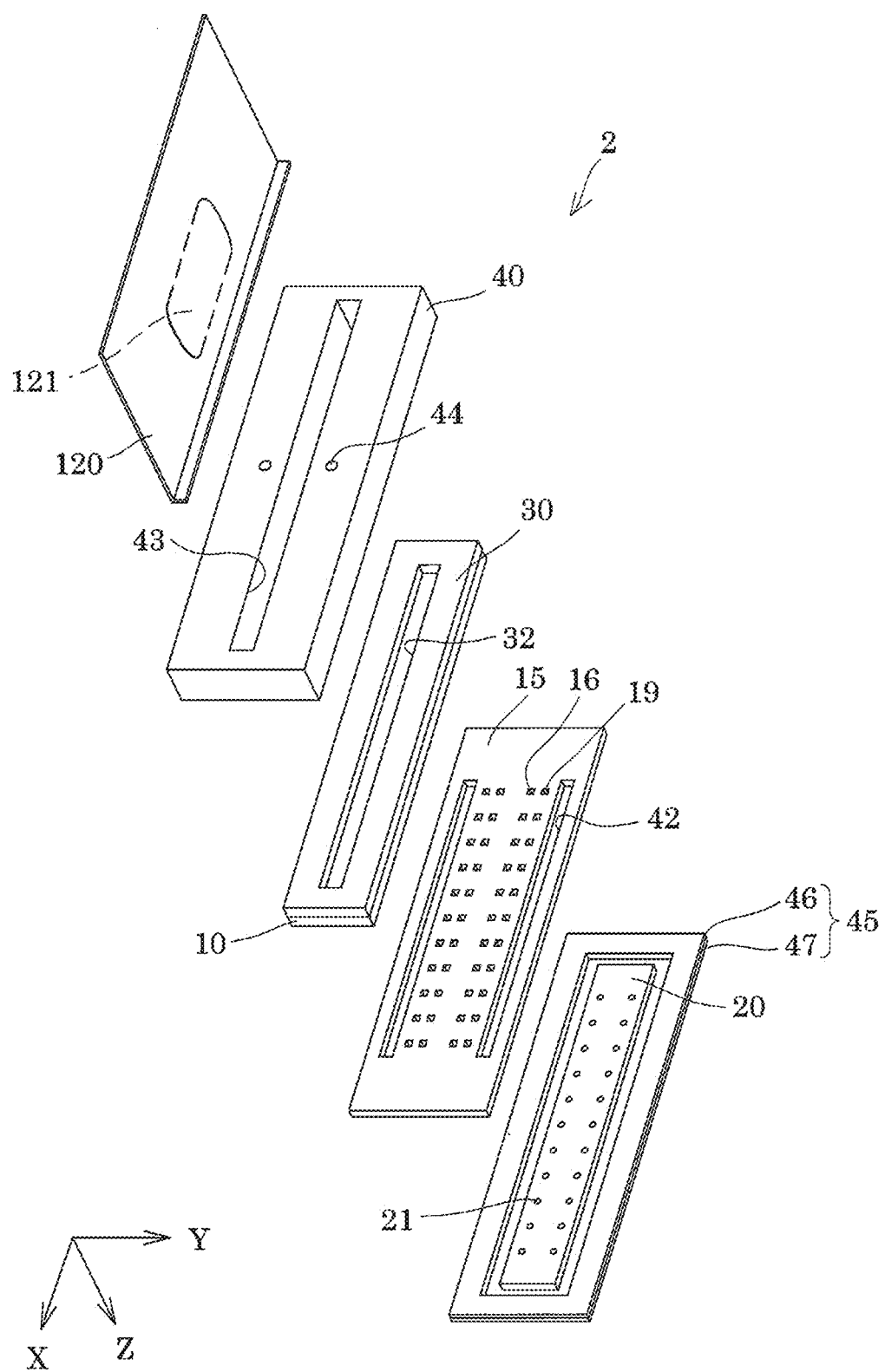
FIG. 2 is an exploded perspective view of a recording head according to Embodiment 1.
Figure 3:
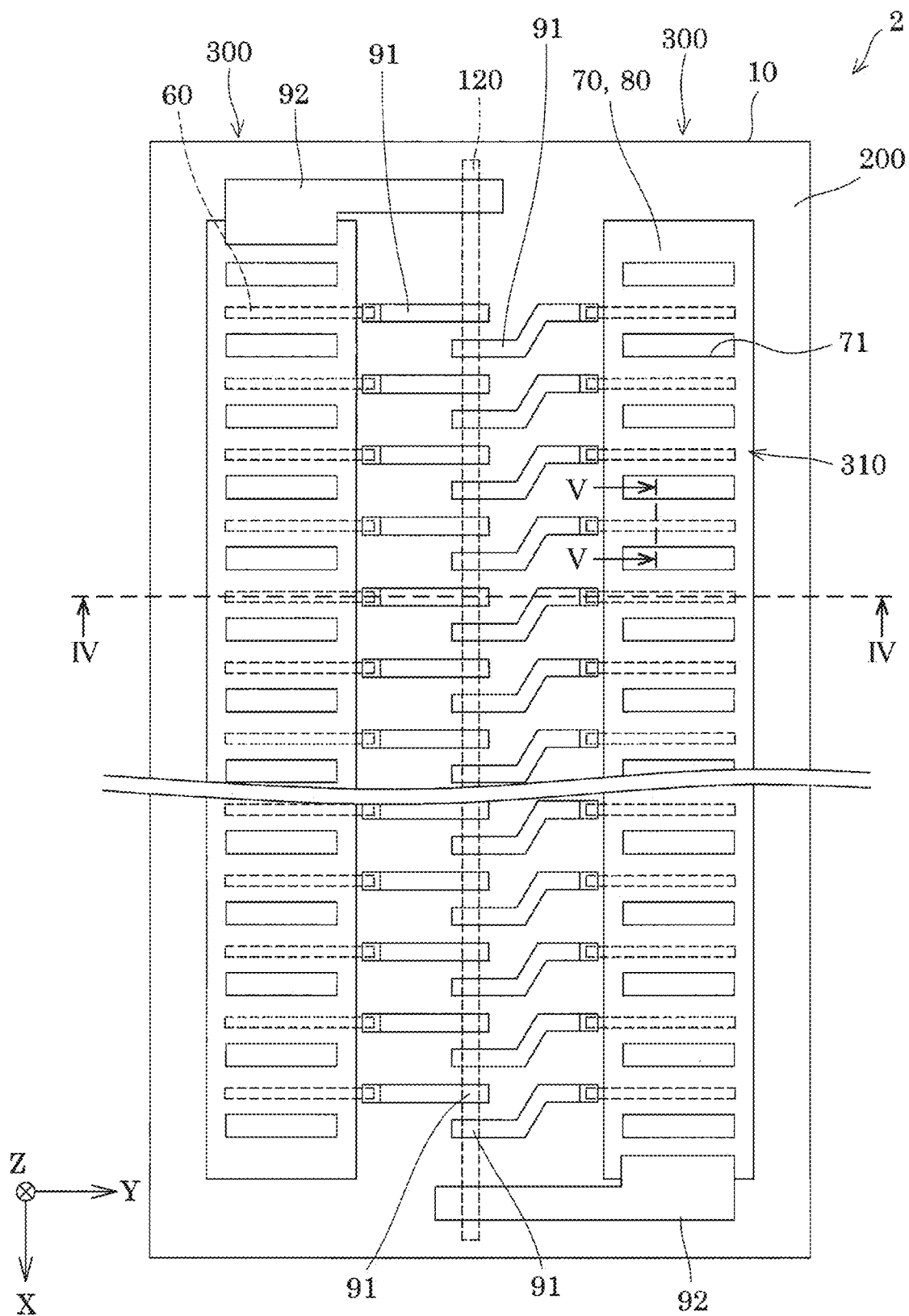
FIG. 3 is a plan view of a flow path formation substrate for the recording head according to Embodiment 1.
Figure 4:
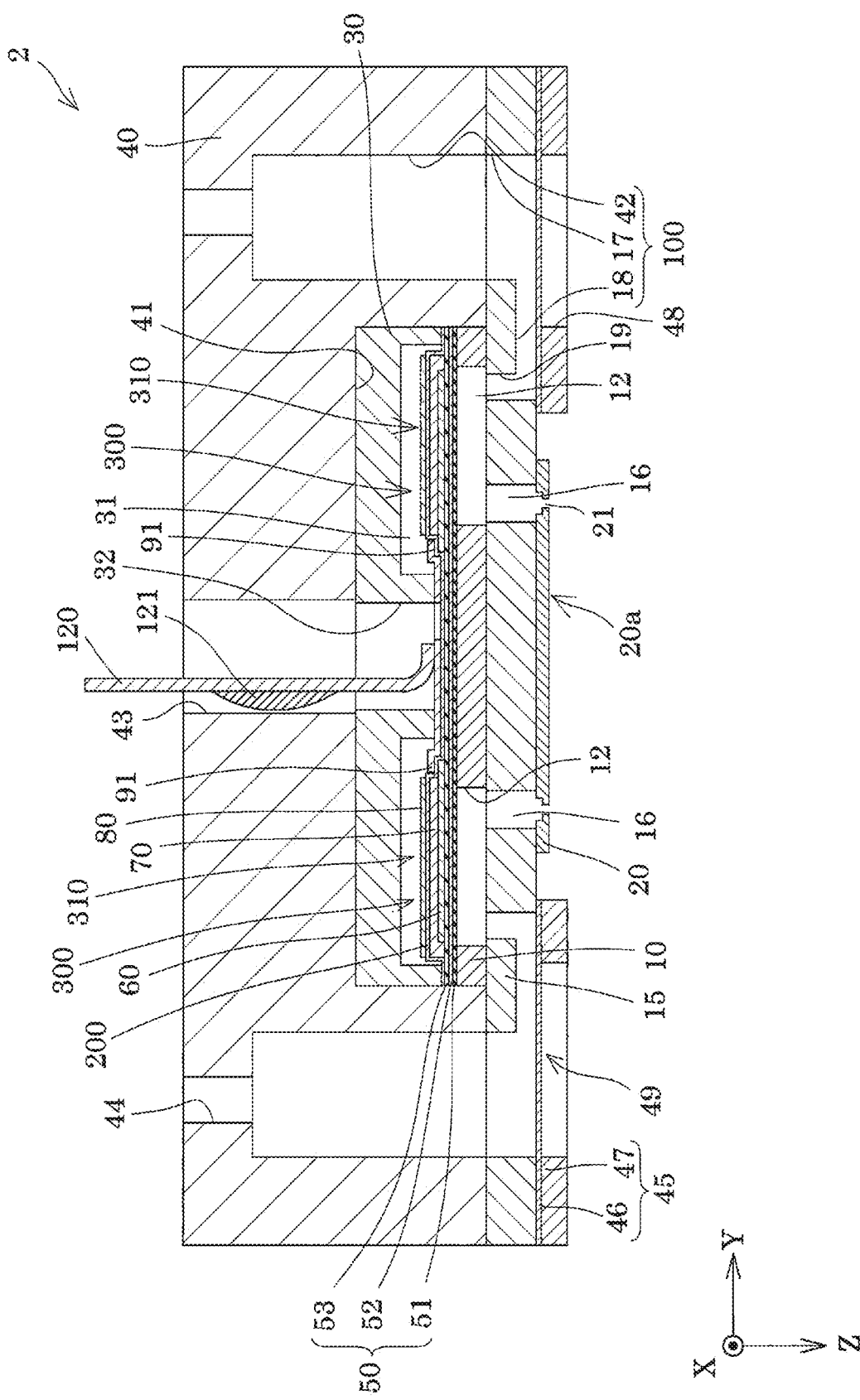
FIG. 4 is a cross-sectional view of the recording head according to Embodiment 1.
Figure 5:
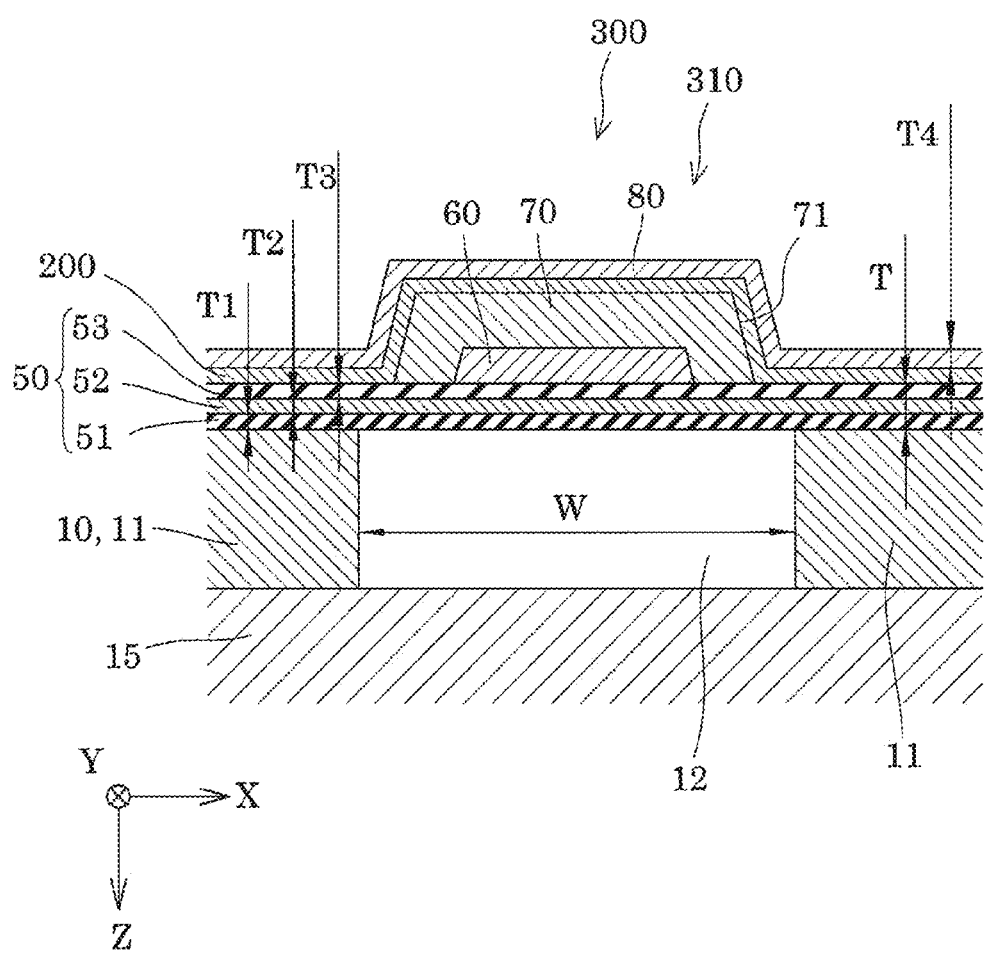
FIG. 5 is a cross-sectional view of the recording head according to Embodiment 1.

FIG. 2 is an exploded perspective view of an ink jet recording head 2 which is an example of the liquid ejecting head of the present embodiment. FIG. 3 is a plan view of the flow path formation substrate 10 of the recording head 2. FIG. 4 is a cross-sectional view of the recording head 2 according to the line IV-IV of FIG. 3. FIG. 5 is a cross-sectional view of the recording head 2 according to the line V-V of FIG. 3.

As illustrated in the figure, the recording head 2 of the present embodiment includes a flow path formation substrate 10 as an example of the "substrate". The flow path formation substrate 10 includes a silicon substrate, a glass substrate, an SOI substrate, and various ceramic substrates.

A plurality of pressure chambers 12 are arranged side by side in the +X direction, which is the first direction, on the flow path formation substrate 10. The plurality of pressure chambers 12 are disposed on a straight line along the +X direction so that the positions in the +Y direction are the same. The pressure chambers 12 adjacent to each other in the +X direction are partitioned by a partition wall 11. As a matter of course, the arrangement of the pressure chambers 12 is not particularly limited thereto, and for example, may be a so-called staggered arrangement in which every other pressure chamber 12 is disposed at positions shifted in the +Y direction, in the pressure chambers 12 arranged side by side in the +X direction.

In addition, the pressure chamber 12 of the present embodiment when viewed in the +Z direction may be a so-called oval shape such as a rounded rectangular shape, an elliptical shape, and an egg shape, with both end portions in the longitudinal direction as a semicircle shape based on a rectangular shape, a parallel quadrilateral shape, or an oblong shape, a circular shape, a polygonal shape, or the like. The pressure chamber 12 corresponds to a "recessed portion" provided in the "substrate".

The communication plate 15 and the nozzle plate 20 are sequentially laminated on the flow path formation substrate 10 on the +Z direction side.

The communication plate 15 is provided with a nozzle communication passage 16 that communicates with the pressure chamber 12 and the nozzle 21.

In addition, the communication plate 15 is provided with a first manifold portion 17 and a second manifold portion 18 that form a part of a manifold 100 which is a common liquid chamber with which the plurality of pressure chambers 12 communicate in common. The first manifold portion 17 is provided so as to penetrate the communication plate 15 in the +Z direction. In addition, the second manifold portion 18 is provided so as to open in the surface on the +Z direction side without penetrating the communication plate 15 in the +Z direction.

Furthermore, the communication plate 15 is provided with a supply communication passage 19 communicating with the end portion of the Y axis of the pressure chamber 12 independently in each of the pressure chambers 12. The supply communication passage 19 communicates with the second manifold portion 18 and the pressure chamber 12 to supply the ink in the manifold 100 to the pressure chamber 12.

As such a communication plate 15, a silicon substrate, a glass substrate, an SOI substrate, various ceramic substrates, a metal substrate such as a stainless steel substrate, or the like can be used. It is preferable that the communication plate 15 uses a material substantially the same as the coefficient of thermal expansion of the flow path formation substrate 10. By using a material having substantially the same coefficient of thermal expansion between the flow path formation substrate 10 and the communication plate 15 in this manner, it is possible to reduce the occurrence of warpage due to heat due to the difference in the coefficient of thermal expansion.

The nozzle plate 20 is provided on the side of the communication plate 15 opposite to the flow path formation substrate 10, that is, on the surface on the +Z direction side.

The nozzle plate 20 is formed with the nozzles 21 that communicate with each of the pressure chambers 12 via the nozzle communication passage 16. In the present embodiment, the plurality of nozzles 21 are provided with two rows of nozzles arranged side by side in a row along the +X direction and separated from each other in the +Y direction. That is, the plurality of nozzles 21 in each row are disposed so that the positions in the +Y direction are the same as each other. As a matter of course, the arrangement of the nozzles 21 is not particularly limited thereto, and for example, may be a so-called staggered arrangement in which every other nozzle 21 is disposed at positions shifted in the +Y direction, in the nozzles 21 arranged side by side in the +X direction.

As such a nozzle plate 20, a silicon substrate, a glass substrate, an SOI substrate, various ceramic substrates, a metal substrate such as a stainless steel substrate, an organic substance such as a polyimide resin, or the like can be used. It is preferable to use a material for the nozzle plate 20 that is substantially the same as the coefficient of thermal expansion of the communication plate 15. By using materials having substantially the same coefficient of thermal expansion between the nozzle plate 20 and the communication plate 15 in this manner, it is possible to reduce the occurrence of warpage due to heat due to the difference in the coefficient of thermal expansion.

The diaphragm 50 and the piezoelectric actuator 300 are sequentially laminated on the surface of the flow path formation substrate 10 on the −Z direction side. That is, the flow path formation substrate 10, the diaphragm 50, and the piezoelectric actuator 300 are laminated in this order in the −Z direction. A fourth layer 200 is provided on the diaphragm 50 on the piezoelectric actuator 300 side. The diaphragm 50, the piezoelectric actuator 300, and the fourth layer 200 will be described in detail later.

As illustrated in FIGS. 2 and 4, a protective substrate 30 having substantially the same size as the flow path formation substrate 10 is bonded to the surface of the flow path formation substrate 10 in the −Z direction. The protective substrate 30 has a holding portion 31 which is a space for protecting the piezoelectric actuator 300. The holding portions 31 are independently provided for each row of the piezoelectric actuators 300 arranged side by side in the +X direction, and are formed in two side by side in the +Y direction. In addition, the protective substrate 30 is provided with a through-hole 32 penetrating in the +Z direction between two holding portions 31 arranged side by side in the +Y direction. The end portions of an individual lead electrode 91 and a common lead electrode 92 drawn from the electrodes of the piezoelectric actuator 300 are extended so as to be exposed in the through-hole 32, and the individual lead electrode 91 and the common lead electrode 92, and the wiring substrate 120 are electrically coupled to one another in the through-hole 32.

In addition, as illustrated in FIG. 4, a case member 40 for defining the manifold 100 communicating with a plurality of pressure chambers 12 together with the flow path formation substrate 10 is fixed on the protective substrate 30. The case member 40 has substantially the same shape as that of the communication plate 15 described above in plan view, and is bonded to the protective substrate 30 and also to the communication plate 15 described above. In the present embodiment, the case member 40 is bonded to the communication plate 15. In addition, although not particularly illustrated, the case member 40 and the protective substrate 30 are also bonded to each other.

Such a case member 40 has a recessed portion 41 having a depth for accommodating the flow path formation substrate 10 and the protective substrate 30 on the protective substrate 30 side. The recessed portion 41 has a wider opening area than that of the surface on which the protective substrate 30 is bonded to the flow path formation substrate 10. The opening surface of the recessed portion 41 on the nozzle plate 20 side is sealed by the communication plate 15 in a state where the flow path formation substrate 10 and the like are accommodated in the recessed portion 41. As a result, a third manifold portion 42 is defined by the case member 40 and the flow path formation substrate 10 on the outer peripheral portion of the flow path formation substrate 10. The manifold 100 of the present embodiment is configured to include the first manifold portion 17 and the second manifold portion 18 provided in the communication plate 15, and the third manifold portion 42 defined by the case member 40 and the flow path formation substrate 10. The manifold 100 is continuously provided in the +X direction in which the pressure chambers 12 are arranged side by side, and the supply communication passages 19 that communicate each of the pressure chambers 12 and the manifold 100 are arranged side by side in the +X direction.

In addition, a compliance substrate 45 is provided on the surface of the communication plate 15 on the +Z direction side where the first manifold portion 17 and the second manifold portion 18 open. The compliance substrate 45 seals the openings of the first manifold portion 17 and the second manifold portion 18 on the liquid ejecting surface 20a side. In the present embodiment, such a compliance substrate 45 includes a sealing film 46 made of a flexible thin film and a fixed substrate 47 made of a hard material such as metal. Since a region of the fixed substrate 47 facing the manifold 100 is an opening portion 48 completely removed in the thickness direction, one surface of the manifold 100 is a compliance portion 49 which is a flexible portion sealed only by the flexible sealing film 46.

The diaphragm 50 and the piezoelectric actuator 300 of the present embodiment will be described.

As illustrated in FIGS. 4 and 5, the piezoelectric actuator 300 includes a first electrode 60, a piezoelectric layer 70, and a second electrode 80, which are sequentially laminated from the +Z direction side, which is on the diaphragm 50 side, toward the −Z direction side. The piezoelectric actuator 300 is a pressure generating unit that causes a pressure change in the ink in the pressure chamber 12. Such a piezoelectric actuator 300 is also referred to as a piezoelectric element, and refers to a portion including the first electrode 60, the piezoelectric layer 70, and the second electrode 80. In addition, a portion where piezoelectric strain occurs in the piezoelectric layer 70 when a voltage is applied between the first electrode 60 and the second electrode 80 is referred to as an active portion 310. On the other hand, a portion where piezoelectric strain does not occur in the piezoelectric layer 70 is referred to as an inactive portion. That is, the active portion 310 refers to a portion where the piezoelectric layer 70 is interposed between the first electrode 60 and the second electrode 80. In the present embodiment, the active portion 310 is formed for each pressure chamber 12 which is a recessed portion. That is, a plurality of active portions 310 are formed on the piezoelectric actuator 300. In general, any one of the electrodes of the active portion 310 is configured as an independent individual electrode for each active portion 310, and the other electrode is configured as a common electrode common to the plurality of active portions 310. In the present embodiment, the first electrode 60 constitutes an individual electrode, and the second electrode 80 constitutes a common electrode. As a matter of course, the first electrode 60 may form a common electrode, and the second electrode 80 may form an individual electrode. In the piezoelectric actuator 300, the portion facing the pressure chamber 12 on the Z axis is a flexible portion, and the outer portion of the pressure chamber 12 is a non-flexible portion.

Specifically, as illustrated in FIGS. 3 to 5, the first electrode 60 constitutes an individual electrode that is separated into each pressure chamber 12 and is independent for each active portion 310. The first electrode 60 is formed to have a width narrower than the width of the pressure chamber 12 in the +X direction. That is, the end portion of the first electrode 60 is located inside the region facing the pressure chamber 12 in the +X direction. In addition, as illustrated in FIG. 4, the end portion on the nozzle 21 side is disposed outside the pressure chamber 12 in the Y axis of the first electrode 60. An individual lead electrode 91, which is a lead-out wiring, is coupled to an end portion of the first electrode 60 disposed outside the pressure chamber 12 on the Y axis.

As such a first electrode 60, a material having conductivity, for example, iridium (Ir), platinum (Pt), palladium (Pd), gold (Au), nickel (Ni), chromium (Cr), nickel chromium (NiCr), tungsten (W), titanium (Ti), titanium oxide ($TIO_x$), titanium tungsten (TiW), and the like can be used.

As illustrated in FIGS. 3 to 5, the piezoelectric layer 70 is continuously provided over the +X direction with a predetermined width in the +Y direction. The width of the piezoelectric layer 70 in the +Y direction is longer than the length in the +Y direction, which is the longitudinal direction of the pressure chamber 12. Therefore, the piezoelectric layer 70 extends to the outside of the region facing the pressure chamber 12 on both sides of the pressure chamber 12 in the +Y direction and the −Y direction. The end portion of the piezoelectric layer 70 on the Y axis opposite to the nozzle 21 is located outside the end portion of the first electrode 60. That is, the end portion of the first electrode 60 on the side opposite to the nozzle 21 is covered with the piezoelectric layer 70. In addition, the end portion of the piezoelectric layer 70 on the nozzle 21 side is located inside the end portion of the first electrode 60, and the end portion of the first electrode 60 on the nozzle 21 side is not covered with the piezoelectric layer 70. As described above, the individual lead electrode 91 made of gold (Au) or the like is coupled to the end portion of the first electrode 60 extending to the outside of the piezoelectric layer 70.

In addition, the piezoelectric layer 70 is formed with a recessed portion 71 corresponding to each partition wall 11. The width of the recessed portion 71 in the +X direction is the same as or wider than the width of the partition wall 11. In the present embodiment, the width of the recessed portion 71 in the +X direction is wider than the width of the partition wall 11. As a result, the rigidity of the portion of the pressure chamber 12 of the diaphragm 50 facing both end portions in the +X direction and the −X direction, that is, an arm portion of the diaphragm 50 is suppressed, so that the piezoelectric actuator 300 can be satisfactorily displaced. In addition, the recessed portion 71 may be provided so as to penetrate the piezoelectric layer 70 in the +Z direction, which is the thickness direction, and may be provided halfway in the thickness direction of the piezoelectric layer 70 without penetrating the piezoelectric layer 70 in the +Z direction. That is, the piezoelectric layer 70 may be completely removed from the bottom surface of the recessed portion 71 in the +Z direction, or a part of the piezoelectric layer 70 may remain.

Such a piezoelectric layer 70 is made of a piezoelectric material made of a composite oxide having a perovskite structure represented by the general formula $ABO_3$. In the present embodiment, lead zirconate titanate (PZT; Pb (Zr, Ti) $O_3$) is used as the piezoelectric material. By using PZT as the piezoelectric material, the piezoelectric layer 70 having a relatively large piezoelectric constant d31 can be obtained.

In the composite oxide having a perovskite structure represented by the general formula $ABO_3$, oxygen is 12-coordinated to the A site and oxygen is 6-coordinated to the B site to form an octahedron. In the present embodiment, lead (Pb) is located at the A site, and zirconium (Zr) and titanium (Ti) are located at the B site.

The piezoelectric material is not limited to the above PZT. Other elements may be contained in the A site and the B site. For example, the piezoelectric material may be a perovskite material such as barium zirconate titanate (Ba (Zr, Ti) O$_3$), lead zirconate titanate lanthanum ((Pb, La) (Zr, Ti) O$_3$), lead zirconium titanate magnesium niobate(Pb (Zr, Ti) (Mg, Nb) O$_3$), and lead zirconate titanate niobate (Pb (Zr, Ti, Nb) O$_3$) containing silicon.

In addition, the piezoelectric material may be a material having a reduced Pb content, a so-called low lead-based material, or a material that does not use Pb, a so-called lead-free material. When a low lead-based material is used as the piezoelectric material, the amount of Pb used can be reduced. In addition, when a lead-free material is used as the piezoelectric material, it is not necessary to use Pb. Therefore, the environmental load can be reduced by using a low lead-based material or a lead-free material as the piezoelectric material.

Examples of the lead-free piezoelectric material include a BFO-based material containing bismuth iron acid (BFO; BiFeO$_3$). In the BFO, bismuth (Bi) is located at the A site and iron (Fe) is located at the B site. Other elements may be added to BFO. For example, at least one element selected from manganese (Mn), aluminum (Al), lanthanum (La), barium (Ba), titanium (Ti), cobalt (Co), cerium (Ce), samarium (Sm), chromium (Cr), potassium (K), lithium (Li), calcium (Ca), strontium (Sr), vanadium (V), niobium (Nb), tantalum (Ta), molybdenum (Mo), tungsten (W), nickel (Ni), zinc (Zn), praseodymium (Pr), neodymium (Nd), and europium (Eu) may be added to BFO.

In addition, as another example of the lead-free piezoelectric material, there is a KNN-based material containing potassium niobate sodium (KNN; KNaNbO$_3$). Other elements may be added to KNN. For example, at least one element selected from manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), copper (Cu), vanadium (V), chromium (Cr), molybdenum (Mo), tungsten (W), nickel (Ni), aluminum (Al), silicon (Si), lanthanum (La), cerium (Ce), praseodymium (Pr), neodymium (Nd), promethium (Pm), samarium (Sm), and europium (Eu) may be added to KNN.

Piezoelectric materials also include a material having a composition in which a part of the element is missing, a material having a composition in which a part of the element is in excess, and a material having a composition in which a part of the element is replaced with another element. Unless the basic characteristics of the piezoelectric layer 70 change, a material deviating from the composition of stoichiometry due to defects or excess, or a material in which a part of an element is replaced with another element is also included in the piezoelectric material according to the present embodiment. As a matter of course, the piezoelectric material that can be used in the present embodiment is not limited to the material containing Pb, Bi, Na, K, and the like as described above.

As illustrated in FIGS. 2 to 5, the second electrode 80 is continuously provided on the –Z direction side opposite to the first electrode 60 of the piezoelectric layer 70, and constitutes a common electrode common to the plurality of active portions 310. The second electrode 80 is continuously provided in the +X direction so that the +Y direction has a predetermined width. In addition, the second electrode 80 is also provided on the inner surface of the recessed portion 71, that is, on the side surface of the recessed portion 71 of the piezoelectric layer 70 and on the diaphragm 50 which is the bottom surface of the recessed portion 71. As a matter of course, the second electrode 80 may be provided only on a part of the inner surface of the recessed portion 71, or may not be provided over the entire inner surface of the recessed portion 71. That is, in the present embodiment, on the flow path formation substrate 10, the second electrode 80 is not provided at the end portions of the piezoelectric actuator 300 on the +Y direction side and the –Y direction side and the diaphragm 50 is provided so as to be exposed on the surface in the –Z direction.

As the material of the second electrode 80, precious metal materials such as iridium (Ir), platinum (Pt), palladium (Pd), and gold (Au), and conductive oxides typified by lanthanum nickel oxide (LNO) are used. In addition, the second electrode 80 may be a laminate of a plurality of materials. As the second electrode 80, it is preferable to use one containing iridium (Ir) and titanium (Ti). In the present embodiment, the second electrode 80 uses a laminated electrode of iridium (Ir) and titanium (Ti).

In addition, an individual lead electrode 91, which is a lead-out wiring, is drawn out from the first electrode 60. A common lead electrode 92, which is a lead-out wiring, is drawn out from the second electrode 80. As described above, the flexible wiring substrate 120 is coupled to the end portion of the individual lead electrode 91 and the common lead electrode 92 on the side opposite to the end portion coupled to the piezoelectric actuator 300. The wiring substrate 120 is mounted with a drive circuit 121 having a switching element for driving the piezoelectric actuator 300.

As illustrated in FIG. 5, the diaphragm 50 includes the first layer 51, the second layer 52, and the third layer 53, which are laminated in the –Z direction in this order. That is, the diaphragm 50 includes the first layer 51, the second layer 52 disposed between the first layer 51 and the piezoelectric actuator 300, and the third layer 53 disposed between the second layer 52 and the piezoelectric actuator 300. The first layer 51 is disposed closest to the diaphragm 50 on the flow path formation substrate 10 side, that is, on the +Z direction side, and is in contact with the surface of the flow path formation substrate 10 on the –Z direction side. In addition, the third layer 53 is disposed closest to the diaphragm 50 on the –Z direction side and is in contact with the piezoelectric actuator 300. The second layer 52 is interposed between the layers between the first layer 51 and the third layer 53. In FIGS. 4 and 5, for convenience of description, the interface between the layers constituting the diaphragm 50 is clearly illustrated, the interface does not required to be clear, and for example, the constituent materials of the two layers may be mixed in the vicinity of the interface between the two layers adjacent to each other. The diaphragm 50 having such a first layer 51, a second layer 52, and a third layer 53 is continuously provided over the entire surface of the flow path formation substrate 10 on the –Z direction side.

The first layer 51 is a layer containing silicon (Si) as a constituent element. Specifically, the first layer 51 is, for example, an elastic film made of silicon oxide (SiO$_2$). Here, in addition to silicon oxide and the constituent elements, the first layer 51 may contain a small amount of elements such as zirconium (Zr), titanium (Ti), iron (Fe), chromium (Cr) or hafnium (Hf) as impurities. Such impurities have the effect of softening silicon oxide (SiO$_2$).

As described above, the first layer 51 of the present embodiment contains, for example, silicon oxide. By forming such a first layer 51 by thermally oxidizing a flow path formation substrate 10 made of a silicon single crystal substrate, it is possible to form the first layer 51 with higher productivity than when being formed by a sputtering method.

The silicon in the first layer 51 may exist in the state of an oxide, or may exist in the state of a simple substance, a nitride, an oxynitride, or the like. In addition, the impurities in the first layer 51 may be elements that are inevitably mixed in when the first layer 51 is formed, or may be elements that are intentionally mixed in the first layer 51.

The thickness T1 of the first layer 51 is determined according to the thickness T and the width W of the diaphragm 50. The thickness T1 of the first layer 51 is preferably, for example, in the range of 100 nm or more and 20000 nm or less, and more preferably in the range of 500 nm or more and 1500 nm or less.

The third layer 53 is a layer containing zirconium (Zr) as a constituent element. Specifically, the third layer 53 is, for example, an insulating film made of zirconium oxide ($ZrO_2$). Here, in addition to zirconium oxide and the constituent elements, the third layer 53 may contain a small amount of elements such as titanium (Ti), iron (Fe), chromium (Cr) or hafnium (Hf) as impurities. Such impurities have the effect of softening zirconium oxide ($ZrO_2$).

As described above, the third layer 53 contains, for example, zirconium oxide. For example, such a third layer 53 can be obtained by forming a layer of zirconium alone by a sputtering method or the like, and then thermally oxidizing the layer. Therefore, when forming the third layer 53, the third layer 53 having a desired thickness can be easily obtained. In addition, since zirconium oxide has excellent electrical insulation, mechanical strength, and toughness, the characteristics of the diaphragm 50 can be enhanced by containing zirconium oxide in the third layer 53. In addition, for example, when the piezoelectric layer 70 is made of lead zirconate titanate, the third layer 53 contains zirconium oxide, so that when forming the piezoelectric layer 70, there is also an advantage that it is easy to obtain the piezoelectric layer 70 preferentially oriented to the (100) plane with a high orientation rate.

The zirconium in the third layer 53 may exist in the state of an oxide, or may exist in the state of a simple substance, a nitride, an oxynitride, or the like. In addition, the impurities in the third layer 53 may be elements that are inevitably mixed in when the third layer 53 is formed, or may be elements that are intentionally mixed in the third layer 53. For example, the impurities are impurities contained in the zirconium target used when the third layer 53 is formed by the sputtering method.

The thickness T3 of the third layer 53 is determined according to the thickness T and the width W of the diaphragm 50. The thickness T3 of the third layer 53 is preferably in the range of, for example, 100 nm or more and 20000 nm or less.

The second layer 52 is interposed between the first layer 51 and the third layer 53. Therefore, contact between the first layer 51 and the third layer 53 is prevented. Therefore, it is reduced that the silicon oxide in the first layer 51 is deoxidized by the zirconium in the third layer 53 as compared with the configuration in which the first layer 51 and the third layer 53 are in contact with each other.

The second layer 52 functions as a moisture shielding film that suppresses the formation of voids at the interface with the third layer and suppresses the entry of moisture into the interface between the second layer and the third layer.

Such a second layer 52 is a layer containing any one or both of at least one metal element selected from the group consisting of chromium (Cr), titanium (Ti), aluminum (Al), tantalum (Ta), hafnium (Hf), and iridium (Ir), and a layer containing silicon and nitrogen such as silicon nitride (SiN) such as the chemical formula of $Si_3N_4$, as a constituent element. Such a metal element of the second layer 52 may exist in the state of an oxide, or may exist in the state of a simple substance, a nitride or an oxynitride. In addition, the second layer 52 may contain only one of the metal elements described above, or may contain two or more metal elements. In addition, the second layer 52 may contain both the metal element and silicon nitride described above.

In addition, the second layer 52 is preferably a layer containing a metal element that is unlikely to be oxidized than zirconium, and the second layer 52 is preferably made of, for example, an oxide of the metal element. In other words, the second layer 52 preferably contains a metal element having larger free energy for oxide formation than zirconium. The metal element preferably contains any metal element of chromium, titanium, and aluminum, and is preferably made of an oxide of the metal element. The magnitude relationship of the free energy for oxide formation can be evaluated based on, for example, a known Ellingham diagram.

Since the second layer 52 contains a metal element that is unlikely to be oxidized than zirconium, the reduction of the silicon oxide contained in the first layer 51 can be reduced as compared with the configuration in which the metal element contained in the second layer 52 is likely to be oxidized than zirconium, that is, the free energy for oxide formation of the metal element contained in the second layer 52 is smaller than that of zirconium. As a result, the adhesion between the first layer 51 and the third layer 53 can be enhanced as compared with the configuration in which the second layer 52 is not used.

In addition, since the second layer 52 is made of oxides of chromium, titanium, and aluminum, the adhesion to the first layer 51 and the third layer 53 can be enhanced more than that of a simple substance, a nitride or a carbon-based material.

Chromium is unlikely to be oxidized than silicon. In other words, the free energy for oxide formation of chromium is larger than that of silicon. Therefore, when chromium is contained as a metal element in the second layer 52, the reduction of the silicon oxide contained in the first layer can be reduced as compared with the case where the metal element that is unlikely to be oxidized than silicon is not contained in the second layer 52.

In addition, when the second layer 52 contains chromium, for example, chromium constitutes an oxide, and the second layer 52 contains chromium oxide. Such a second layer 52 is obtained by forming a layer of chromium alone by a sputtering method or the like and then thermally oxidizing the layer. Therefore, when forming the second layer 52, the second layer 52 having a desired thickness can be easily obtained.

Here, the chromium oxide contained in the second layer 52 may be in any state of polycrystalline, amorphous, or single crystal. However, when the chromium oxide contained in the second layer 52 has an amorphous structure in an amorphous state, the compressive stress generated in the second layer 52 can be reduced as compared with the case where the chromium oxide contained in the second layer 52 is in a polycrystalline or single crystal state. As a result, it is possible to reduce the strain generated at the interface between the first layer 51 or the third layer 53 and the second layer 52.

Titanium or aluminum oxides are easily transferred by heat. Therefore, when titanium or aluminum is contained as a metal element in the second layer 52, the adhesion between the layers of each of the first layer 51 or the third layer 53 and the second layer 52 can be enhanced by the anchor effect or the chemical bond due to the oxide of the metal element. Moreover, titanium is likely to form an oxide together with silicon or zirconium. Therefore, when titanium is contained as a metal element in the second layer 52, by forming an oxide together with silicon, titanium can enhance the adhesion between the first layer 51 and the second layer 52, or by forming an oxide together with zirconium, titanium can enhance the adhesion between the second layer 52 and the third layer 53.

In addition, when the second layer 52 contains titanium, for example, titanium constitutes an oxide, and the second layer 52 contains titanium oxide. Such a second layer 52 is obtained by forming a layer of titanium alone by a sputtering method or the like and then thermally oxidizing the layer. Therefore, when forming the second layer 52, the second layer 52 having a desired thickness can be easily obtained.

Here, the titanium oxide contained in the second layer 52 may be in any state of polycrystalline, amorphous, or single crystal. However, the titanium oxide contained in the second layer 52 is preferably in a polycrystalline or single crystal state, and particularly preferably has a rutile structure as a crystal structure. Among the crystal structures that titanium oxide can take, the rutile structure is the most stable, and even when the rutile structure is moved by heat, the rutile structure does not easily change to polymorphs such as anatase or brookite. Therefore, the thermal stability of the second layer 52 can be enhanced as compared with the case where the crystal structure of titanium oxide contained in the second layer 52 is another crystal structure.

In addition, when the second layer 52 contains aluminum, for example, aluminum constitutes an oxide, and the second layer 52 contains aluminum oxide. Such a second layer 52 is obtained by forming a layer of aluminum alone by a sputtering method or the like and then thermally oxidizing the layer. Therefore, when forming the second layer 52, the second layer 52 having a desired thickness can be easily obtained.

Here, the aluminum oxide contained in the second layer 52 may be in any state of polycrystalline, amorphous, or single crystal, and when the aluminum oxide is in the state of polycrystalline or single crystal, the aluminum oxide has a trigonal crystal system structure as a crystal structure.

In addition, in addition to the metal elements described above, the second layer 52 may contain a small amount of elements such as titanium (Ti), silicon (Si), iron (Fe), chromium (Cr) or hafnium (Hf) as impurities. For example, the impurity is an element contained in the first layer 51 or the third layer 53. The impurity exists, for example, in the state of an oxide together with the metal element of the second layer 52. Even when the diffusion of silicon from the first layer 51 to the second layer 52 is reduced, or even when the silicon diffuses from the first layer 51 to the second layer 52, such impurities have the effect of suppressing the diffusion of the silicon into the third layer 53.

From this point of view, it is preferable that each of the second layer 52 and the third layer 53 contains impurities. When each of the second layer 52 and the third layer 53 contains impurities, by softening each of the second layer 52 and the third layer 53 as compared with the case where impurities are not contained, the risk of cracks in the diaphragm can be reduced.

Here, the content of impurities in the second layer 52 is preferably higher than the content of impurities in the third layer 53. In other words, it is preferable that the concentration peak of impurities in the thickness direction in the laminate made of the second layer 52 and the third layer 53 is located in the second layer 52. In this case, it is possible to prevent or reduce the formation of a gap at the interface between the second layer 52 and the third layer 53 or in the third layer 53. On the other hand, when the concentration peak is located in the third layer 53, the crystal structure in the third layer 53 is distorted by impurities. Therefore, a gap is formed at the interface between the second layer 52 and the third layer 53 or in the third layer 53, and as a result, the risk of cracks in the diaphragm 50 may increase.

The metal element in the second layer 52 described above may exist in the state of an oxide, or may exist in the state of a simple substance, a nitride, an oxynitride, or the like. In addition, the impurities in the second layer 52 may be elements that are inevitably mixed in when the second layer 52 is formed, or may be elements that are intentionally mixed in the second layer 52.

In addition, the thickness T2 of the second layer 52 is determined according to the thickness T and the width W of the diaphragm 50, is not particularly limited, and the thickness T2 is preferably thinner than each of the thickness T1 of the first layer 51 and the thickness T3 of the third layer 53. In this case, there is an advantage that the characteristics of the diaphragm 50 can be easily optimized.

Specifically, when the metal element contained in the second layer 52 is titanium, the thickness T2 of the second layer 52 is preferably in the range of 20 nm or more and 50 nm or less, and more preferably in the range of 25 nm or more and 40 nm or less. In addition, when the metal element contained in the second layer 52 is aluminum, it is preferably in the range of 20 nm or more and 50 nm or less, and particularly preferably in the range of 20 nm or more and 35 nm or less. In addition, when the metal element contained in the second layer 52 is chromium, it is preferably in the range of 1 nm or more and 50 nm or less, and more preferably in the range of 2 nm or more and 30 nm or less. From here, regardless of whether the metal element contained in the second layer 52 is titanium, aluminum, or chromium, it can be seen that the preferable conditions are satisfied as long as the thickness T2 of the second layer 52 is contained in the range of 20 nm or more and 50 nm or less. When the thickness T2 is within such a range, the effect of enhancing the adhesion between the first layer 51 and the third layer 53 by the second layer 52 can be suitably exhibited.

On the other hand, when the thickness T2 is too thin, depending on the type of metal element contained in the second layer 52 and the like, the effect of reducing the diffusion of simple substances of silicon from the first layer 51 by the second layer 52 tends to decrease. For example, when the second layer 52 is made of titanium oxide, when the thickness T2 is too thin, depending on the heat treatment conditions at the time of manufacture, the silicon alone diffused from the first layer 51 to the second layer 52 may reach the third layer 53. On the other hand, when the thickness T2 is too thick, the heat treatment when manufacturing the second layer 52 may not be sufficiently performed, and as a result of the long time required for the thermal oxidation, the other layers may be adversely affected.

By providing the second layer 52 in this manner, the formation of voids at the interface between the second layer 52 and the third layer 53 can be suppressed. Therefore, it is possible to suppress the invasion of moisture into the interface between the second layer 52 and the third layer 53 from the end surface side of the piezoelectric actuator 300. Therefore, it is possible to prevent the zirconium of the third layer 53 from being embrittled by moisture, and to suppress delamination between the third layer 53 and the upper and lower layers of the third layer 53 and damage such as cracks in the third layer 53.

In the present embodiment, since the second layer 52 is continuously provided over the entire surface of the flow path formation substrate 10 on the −Z direction side, the second layer 52 is provided so as to cover the pressure chamber 12 in a plan view from the +Z direction. That is, the second layer 52 is provided at a position overlapping the pressure chamber 12 in the +Z direction. Incidentally, the second layer 52 may be provided at least in a portion overlapping the pressure chamber 12 in a plan view from the +Z direction, and may not be provided in a region other than the pressure chamber 12, for example, a portion overlapping the partition wall 11. Even in this case, the second layer 52 can suppress the invasion of moisture into the interface with the third layer 53 in the portion overlapping the pressure chamber 12.

In addition, the fourth layer 200 is provided on the third layer 53 of the diaphragm 50, that is, in the −Z direction opposite to the first layer 51 on the Z axis. The fourth layer 200 is provided over substantially the entire surface of the flow path formation substrate 10 on the −Z direction side.

The fourth layer 200 is provided directly above the third layer 53 in the −Z direction in a portion other than the piezoelectric actuator 300, for example, in the recessed portion 71. That is, the fourth layer 200 is in contact with the third layer 53. In addition, in the portion where the piezoelectric actuator 300 is provided, the first electrode 60 and the piezoelectric layer 70 are interposed between the third layer 53 and the fourth layer 200. That is, the second electrode 80 is provided directly above the fourth layer 200 in the −Z direction. In other words, the third layer 53, the first electrode 60, the piezoelectric layer 70, the fourth layer 200, and the second electrode 80 are laminated in this order in the −Z direction. That is, the fact that the fourth layer 200 is provided on the third layer 53 on the piezoelectric layer 70 side means that a configuration in which the fourth layer 200 is provided directly above the third layer 53, and a state where another member is interposed between the fourth layer 200 and the third layer 53, in other words, a state where the fourth layer 200 is provided above the third layer 53.

The fourth layer 200 functions as a moisture shielding film that suppresses the invasion of moisture into the interface between the third layer 53 and the layer on the −Z direction side from the third layer 53, and suppresses the invasion of the moisture from the surface side of the second electrode 80 in the −Z direction.

For such a fourth layer 200, the same material as that of the second layer 52 can be used. That is, the fourth layer 200 is a layer containing any one or both of at least one metal element selected from the group consisting of chromium, titanium, aluminum, tantalum, hafnium, and iridium (Ir), and a layer containing silicon and nitrogen such as silicon nitride (SiN) such as the chemical formula of $Si_3N_4$, as a constituent element. Such a metal element of the fourth layer 200 may exist in the state of an oxide, or may exist in the state of a simple substance, a nitride or an oxynitride. In addition, the fourth layer 200 may contain only one of the metal elements described above, or may contain two or more metal elements. In addition, the fourth layer 200 may contain both the metal element and silicon nitride described above. In particular, the fourth layer 200 is preferably made of an oxide or a nitride of a metal element contained in the second electrode 80. As described above, since the fourth layer 200 is made of oxides or nitrides of the metal element contained in the second electrode 80, the fourth layer 200 and the second electrode 80 are made of materials containing the same metal element, and thus the adhesion between the fourth layer 200 and the second electrode 80 can be improved.

In addition, it is preferable to use a conductive material for the fourth layer 200. However, even when the fourth layer 200 uses a material having an insulating property, by making the thickness T4 of the fourth layer 200 relatively thin, it is possible to suppress the decrease in the electric field strength of the second electrode 80 to the piezoelectric layer 70, and to suppress the decrease in displacement due to the decrease in the electric field strength.

In addition, the fourth layer 200 of the present embodiment can protect the piezoelectric layer 70 from moisture and hydrogen by interposing the piezoelectric layer 70 between the fourth layer 200 and the second layer 52. In addition, by not providing the fourth layer 200 on the piezoelectric layer 70 on the diaphragm 50 side, it is possible to suppress the crystal structure of the piezoelectric layer 70 from being disturbed by the fourth layer 200, and to control the crystal structure of the piezoelectric layer 70 by the third layer 53.

By using the same material as the second layer 52, the fourth layer 200 does not need to prepare a plurality of materials, can be easily manufactured, and the cost can be reduced.

In addition, the thickness T2 of the second layer 52 is preferably thicker than the thickness T4 of the fourth layer 200. That is, it is preferable to satisfy T2>T4. Here, in the diaphragm 50, it is because that the moisture invasion from the first layer 51 side, which is lower than the third layer 53, is easier than the moisture invasion from the second electrode 80 side, which is above the third layer 53. Therefore, by making the thickness T2 of the second layer 52 disposed on the third layer 53 on the first layer 51 side relatively thick, it is possible to make it difficult for moisture to invade from the second layer 52 side, which is the lower side of the third layer 53. In addition, by making the thickness T4 of the fourth layer 200 thinner than the thickness T2 of the second layer 52, it is possible to prevent the deformation of the diaphragm 50 and the piezoelectric actuator 300 from being significantly hindered by the fourth layer 200.

It is preferable that the thickness T4 of the fourth layer 200 is in the range of, for example, 5 nm or more and 20 nm or less because the fourth layer 200 is easily displaced. For example, when the thickness T4 of the fourth layer 200 is too thin, the function of shielding moisture is lowered, and when the thickness T4 of the fourth layer is too thick, as described above, the displacement of the diaphragm 50 and the piezoelectric actuator 300 is hindered.

In the present embodiment, since the fourth layer 200 is continuously provided over substantially the entire surface of the flow path formation substrate 10 on the −Z direction side, the fourth layer 200 is provided so as to cover the pressure chamber 12 in a plan view from the +Z direction. That is, the fourth layer 200 is provided at a position overlapping the pressure chamber 12 in a plan view from the +Z direction. Incidentally, the fourth layer 200 may be provided at least in a portion overlapping the pressure chamber 12 in a plan view from the +Z direction, and may not be provided in a region other than the pressure chamber 12, for example, a portion overlapping the partition wall 11. Even in this case, the fourth layer 200 can suppress the invasion of moisture into the third layer 53 in the portion overlapping the pressure chamber 12.

Figure 6:
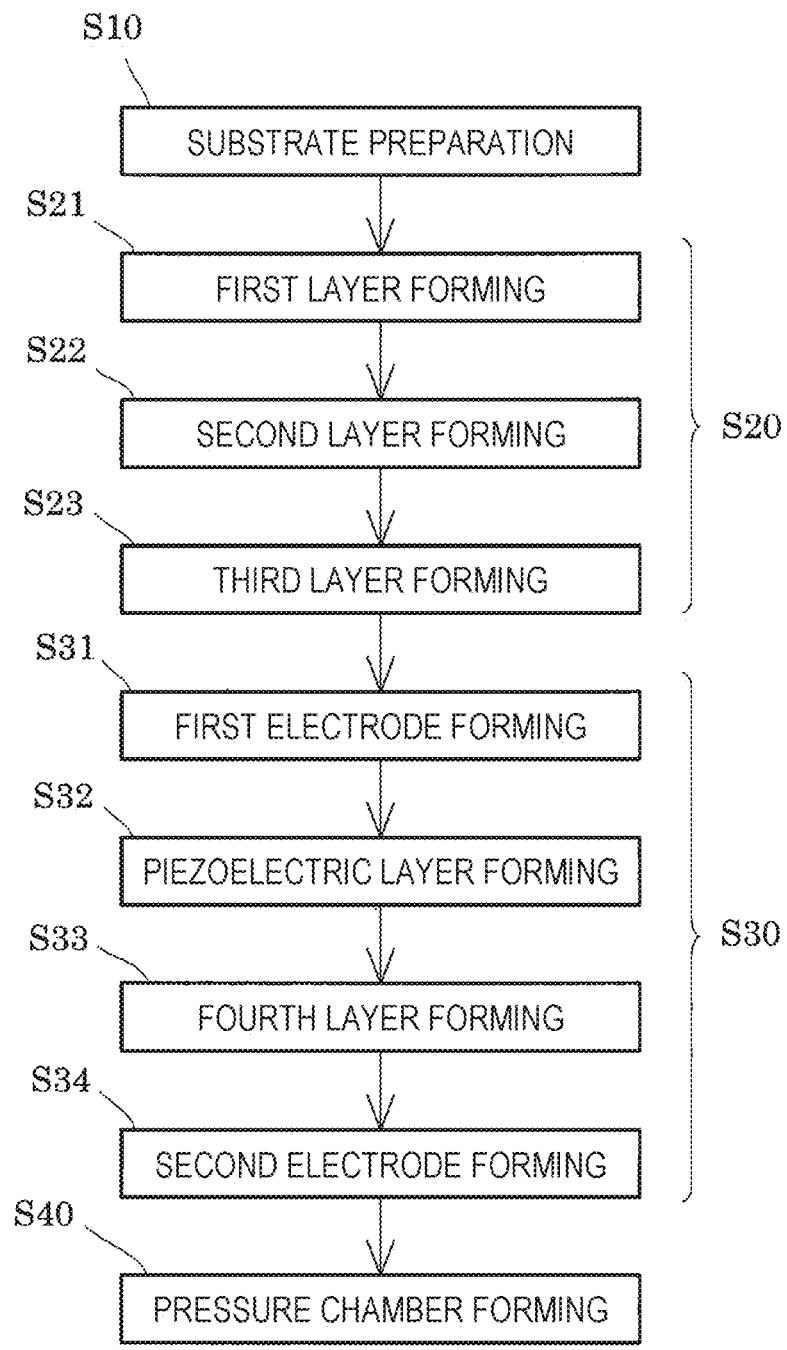
FIG. 6 is a diagram for describing a method of manufacturing a piezoelectric device according to Embodiment 1.

FIG. 6 is a diagram for describing a method of manufacturing a piezoelectric device. Hereinafter, a method of manufacturing a piezoelectric device will be described by taking a case of manufacturing a recording head based on FIG. 6 as an example.

As illustrated in FIG. 6, a method of manufacturing the recording head includes a substrate preparation step S10, a diaphragm forming step S20, a piezoelectric actuator and a fourth layer forming step S30, and a pressure chamber forming step S40. Here, the diaphragm forming step S20 includes a first layer forming step S21, a second layer forming step S22, and a third layer forming step S23. Hereinafter, each step will be described in sequence.

The substrate preparation step S10 is a step of preparing a substrate to be a flow path formation substrate 10. The substrate is, for example, a silicon single crystal substrate.

The diaphragm forming step S20 is a step of forming the diaphragm 50 described above, and is performed after the substrate preparation step S10. In the diaphragm forming step S20, the first layer forming step S21, the second layer forming step S22, and the third layer forming step S23 are performed in this order.

The first layer forming step S21 is a step of forming the first layer 51 described above. In the first layer forming step S21, for example, one surface of the silicon single crystal substrate prepared in the substrate preparation step S10 is thermally oxidized to form a first layer 51 made of silicon oxide ($SiO_2$). The method of forming the first layer 51 is not particularly limited thereto, and may be formed by, for example, a sputtering method, a chemical vapor deposition method (CVD method), a vacuum vapor deposition method (PVD method), an atomic layer deposition method (ALD method), a spin coating method, or the like.

The second layer forming step S22 is a step of forming the second layer 52 described above. In the second layer forming step S22, for example, a layer of chromium, titanium, or aluminum is formed on the first layer 51 by a sputtering method, and a second layer 52 made of chromium oxide, titanium oxide, or aluminum oxide is formed by thermally oxidizing the layer. The method of forming the second layer 52 is not particularly limited thereto, and for example, a CVD method, a PVD method, an ALD method, a spin coating method, or the like may be used. In addition, the thermal oxidation in the second layer forming step S22 may be performed collectively with the thermal oxidation in the third layer forming step S23 described later.

The third layer forming step S23 is a step of forming the third layer 53 described above. In the third layer forming step S23, for example, a zirconium layer is formed on the second layer 52 by a sputtering method, and the layer is thermally oxidized to form a third layer 53 made of zirconium oxide. A diaphragm 50 is formed by the first layer forming step S21, the second layer forming step S22, and the third layer forming step S23. The formation of the third layer 53 is not particularly limited thereto, and for example, a CVD method, a PVD method, an ALD method, a spin coating method, or the like may be used.

The piezoelectric actuator and the fourth layer forming step S30 is a step of forming the piezoelectric actuator 300 and the fourth layer 200 described above, and is performed after the third layer forming step S23. The piezoelectric actuator and the fourth layer forming step S30 includes a first electrode forming step S31, a piezoelectric layer forming step S32, a fourth layer forming step S33, and a second electrode forming step S34.

The first electrode forming step S31 is a step of forming the first electrode 60 described above. In the first electrode forming step S31, the first electrode 60 is formed by, for example, a known film forming technique such as a sputtering method, and a known processing technique using a photolithography method and etching.

The piezoelectric layer forming step S32 is a step of forming the piezoelectric layer 70 described above. For the piezoelectric layer forming step S32, for example, a precursor layer of the piezoelectric layer is formed by a sol-gel method, and the precursor layer is fired and crystallized to form the piezoelectric layer 70. As a matter of course, the method of forming the piezoelectric layer 70 is not particularly limited thereto, and for example, the piezoelectric layer 70 may be formed by a metal-organic decomposition (MOD) method, a sputtering method, a laser ablation method, or the like. In addition, in the piezoelectric layer forming step S32, the piezoelectric layer 70 is formed into a predetermined shape by a known processing technique using a photolithography method, etching, or the like.

The fourth layer forming step S33 is a step of forming the fourth layer 200 described above. In the fourth layer forming step S33, for example, a layer of chromium, titanium, or aluminum is formed on the first layer 51 by a sputtering method, and a second layer 52 made of chromium oxide, titanium oxide, or aluminum oxide is formed by thermally oxidizing the layer. The method of forming the second layer 52 is not particularly limited thereto, and a CVD method, a PVD method, an ALD method, a spin coating method, or the like may be used.

The second electrode forming step S34 is a step of forming the second electrode 80 described above. In the second electrode forming step S34, the second electrode 80 is formed by, for example, a known film forming technique such as a sputtering method, and a known processing technique using a photolithography method and etching. As a result, the piezoelectric actuator 300 having the first electrode 60, the piezoelectric layer 70, and the second electrode 80, and the fourth layer 200 are formed.

After the piezoelectric actuator 300 is formed, if necessary, a surface of both sides of the substrate after the formation, which is different from the surface on which the piezoelectric actuator 300 is formed, is ground by chemical mechanical polishing (CMP) or the like to flatten the surface or to adjust the thickness of the substrate.

The pressure chamber forming step S40 is a step of forming the pressure chamber 12 described above, and is performed after the piezoelectric actuator and the fourth layer forming step S30. In the pressure chamber forming step S40, for example, the pressure chamber 12 is formed by anisotropic etching on a surface of both sides of the silicon single crystal substrate after the formation of the piezoelectric actuator 300, which is different from the surface on which the piezoelectric actuator 300 is formed. As a result, the flow path formation substrate 10 in which the pressure chamber 12 is formed is obtained. At this time, for example, a potassium hydroxide aqueous solution (KOH) or the like is used as the etching solution for anisotropic etching on the silicon single crystal substrate. In addition, at this time, the first layer 51 functions as a stop layer for stopping the anisotropic etching.

After the pressure chamber forming step S40, the recording head 2 is manufactured by appropriately performing a step of bonding the protective substrate 30, the communication plate 15, and the like to the flow path formation substrate 10 with an adhesive.

Embodiment 2

Figure 7:
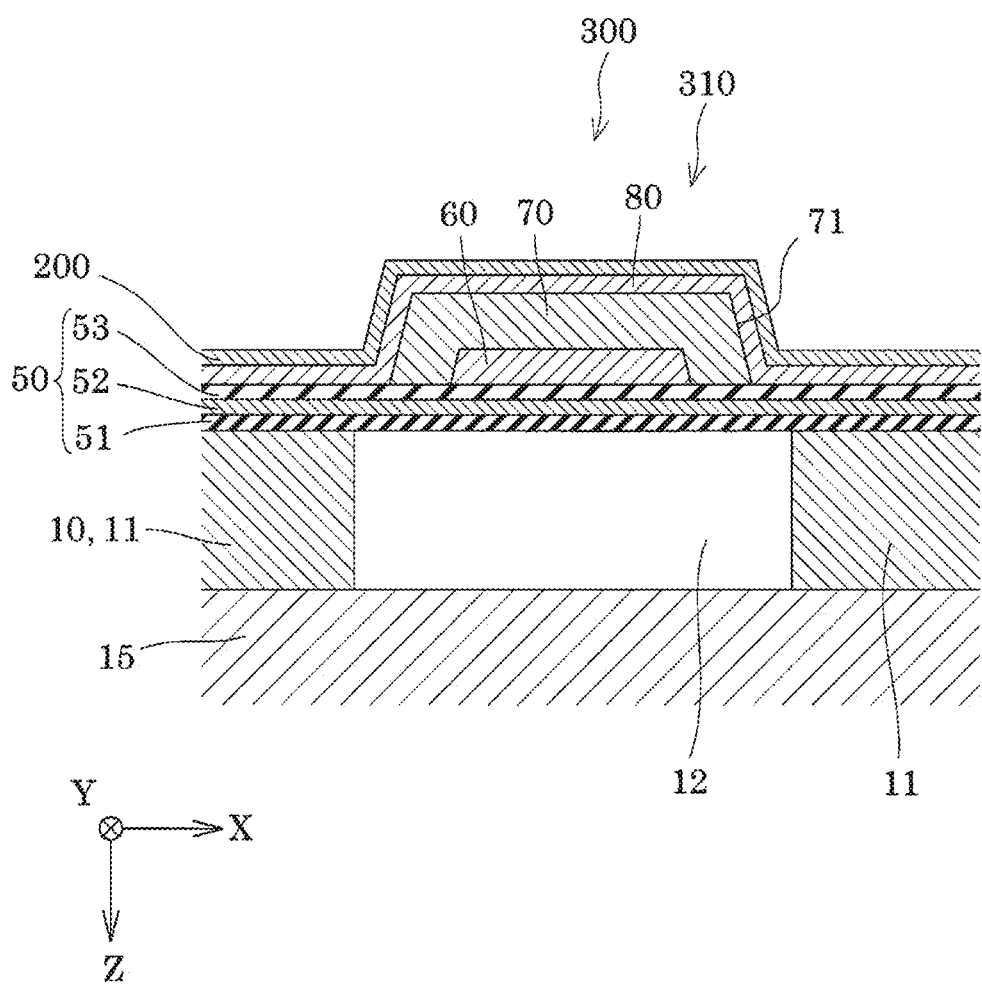
FIG. 7 is a cross-sectional view of a recording head according to Embodiment 2.

FIG. 7 is a cross-sectional view of a main part of the ink jet recording head 2, which is an example of the liquid ejecting head according to Embodiment 2 of the present disclosure. The same members as those in the embodiment described above are designated by the same reference numerals, and redundant description will be omitted.

As illustrated in FIG. 7, the diaphragm 50, the piezoelectric actuator 300, and the fourth layer 200 are provided on the flow path formation substrate 10 the −Z direction side.

The diaphragm 50 includes the first layer 51, the second layer 52, and the third layer 53, as in Embodiment 1 described above.

The first electrode 60, the piezoelectric layer 70, and the second electrode 80 are interposed between the third layer 53 and the fourth layer 200. That is, the fourth layer 200 is provided on the second electrode 80 on the −Z direction side. As a matter of course, in the portion of the third layer 53 where the second electrode 80 is not provided, the fourth layer 200 is provided directly above the third layer 53.

The recording head 2 having such a fourth layer 200 can be formed by exchanging the order of the fourth layer forming step S33 of the piezoelectric actuator and the fourth layer forming step S30 described above, and the second electrode forming step S34. That is, by performing the second electrode forming step S34 to form the second electrode 80 and then performing the fourth layer forming step S33, the fourth layer 200 can be formed over the second electrode 80 and the diaphragm 50.

Sample 1

By thermally oxidizing one surface of the silicon single crystal substrate having the plane orientation (110), the first layer 51 having a thickness of 1460 nm made of silicon oxide was formed.

Next, a film made of zirconium was formed on the first layer 51 by a sputtering method, and the film was thermally oxidized at 900° C. to form a third layer 53 having a thickness of 400 nm made of zirconium oxide.

As described above, a diaphragm made of the first layer 51 and the third layer 53 was prepared.

Sample 2

On the same first layer 51 as Sample 1 described above, a second layer 52 having a thickness of 20 nm made of aluminum oxide was formed by an atomic layer deposition method (ALD method).

Next, the same third layer 53 as Sample 1 was formed on the second layer 52.

As described above, a diaphragm 50 made of the first layer 51, the second layer 52, and the third layer 53 was prepared.

Sample 3

A film made of titanium was formed on the same first layer 51 as Sample 1 described above by a sputtering method, and the film was thermally oxidized to form a second layer 52 having a thickness of 40 nm made of titanium oxide.

Next, the same third layer 53 as Sample 1 was formed on the second layer 52.

As described above, a diaphragm 50 made of the first layer 51, the second layer 52, and the third layer 53 was prepared.

Test Example 1

Figure 8:
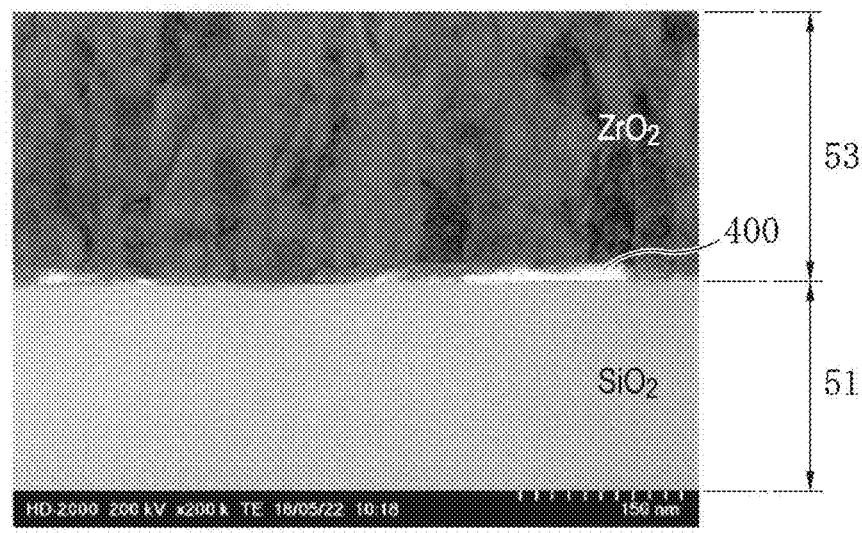
FIG. 8 is a STEM image of Sample 1.

The cross sections of Samples 1 to 3 were observed by a scanning transmission electron microscope (STEM). The results are illustrated in FIGS. 8 to 10.

Figure 11:
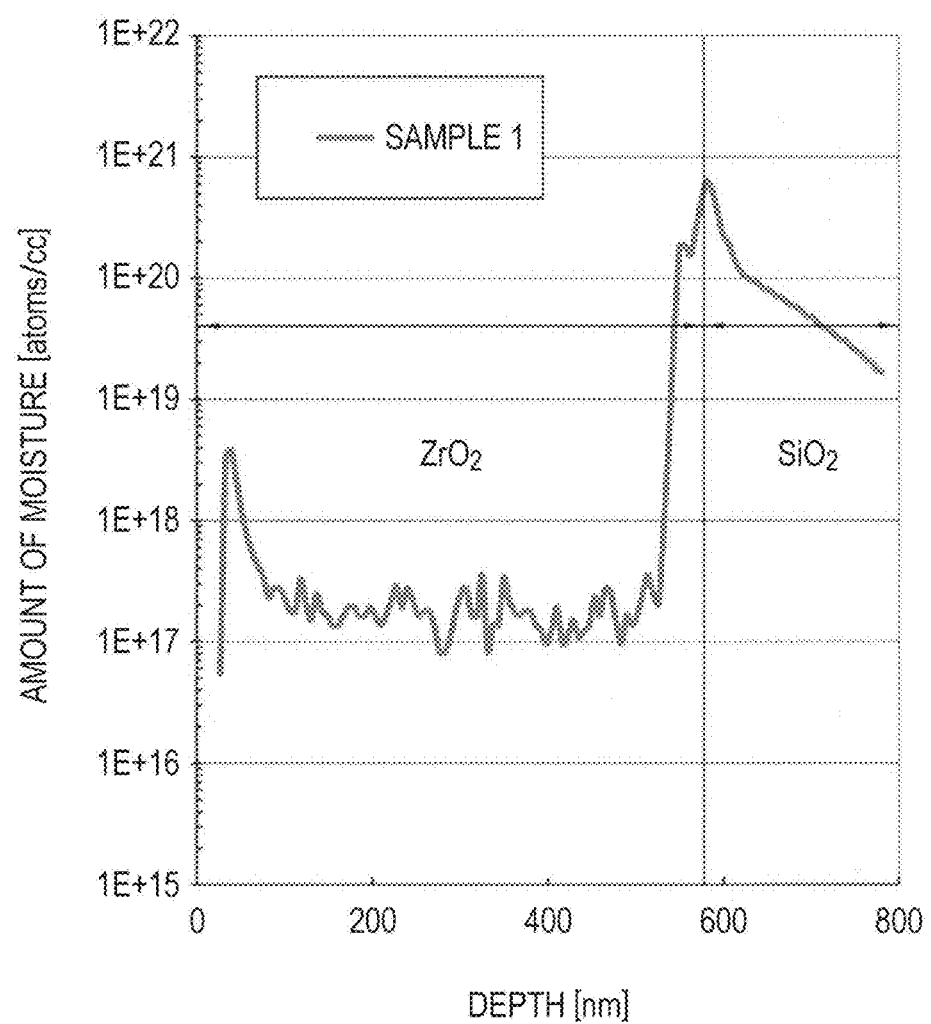
FIG. 11 is a graph illustrating an analysis result of Sample 1 by SIMS.

In addition, Samples 1 to 3 were exposed to a water vapor content atmosphere of heavy water having a temperature of 45° C. and a humidity of 95% RH or more for 24 hours or more, and analyzed by secondary ion mass spectrometry (SIMS). The results are illustrated in FIGS. 11 to 13.

Figure 9:
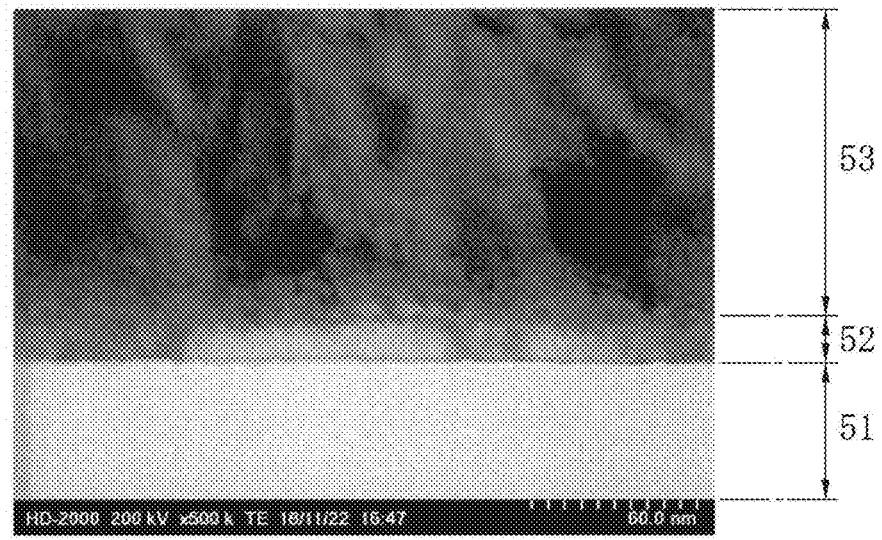
FIG. 9 is a STEM image of Sample 2.
Figure 10:
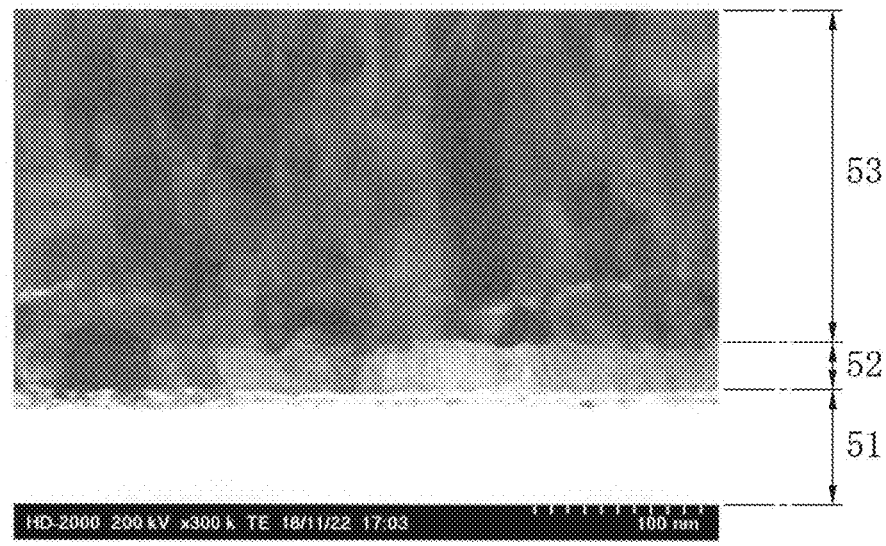
FIG. 10 is a STEM image of Sample 3.

As illustrated in FIGS. 9 and 10, in Sample 2 and Sample 3, there was no gap between the second layer 52 and the third layer 53. On the other hand, as illustrated in FIG. 8, in Sample 1, a gap 400 was formed between the first layer 51 and the third layer 53.

Figure 12:
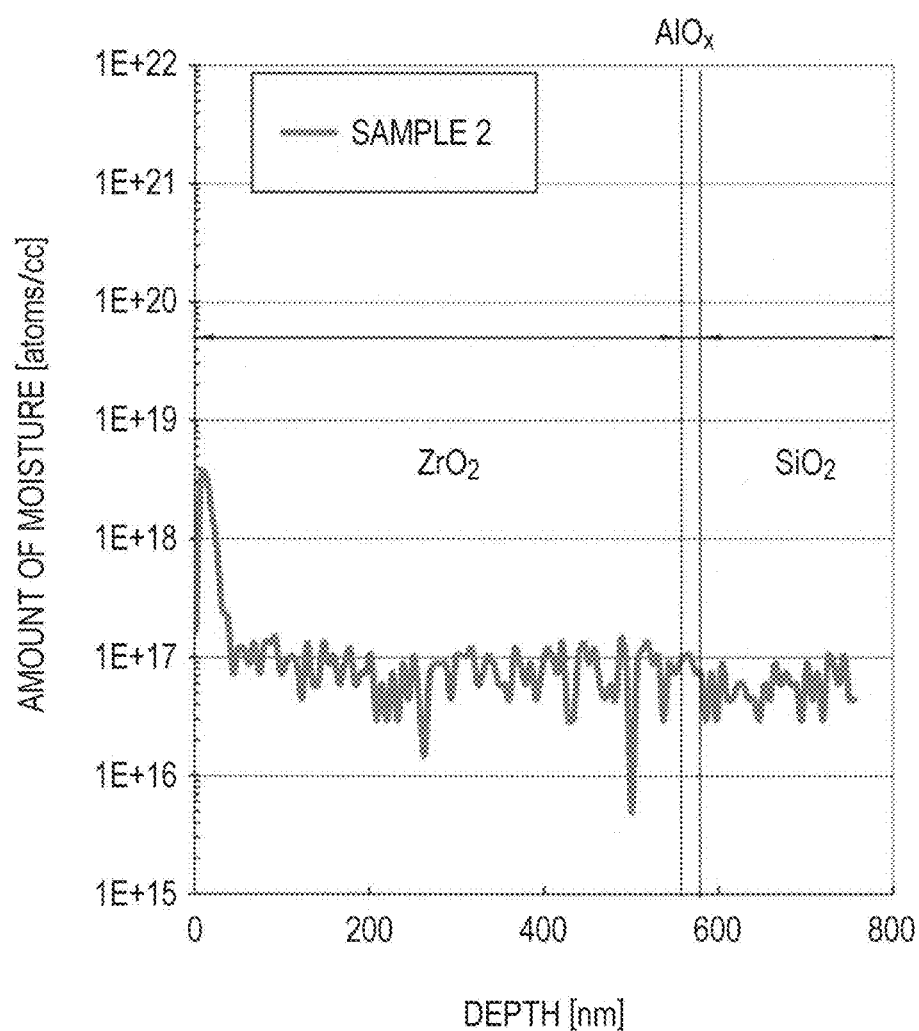
FIG. 12 is a graph illustrating an analysis result of Sample 2 by SIMS.
Figure 13:
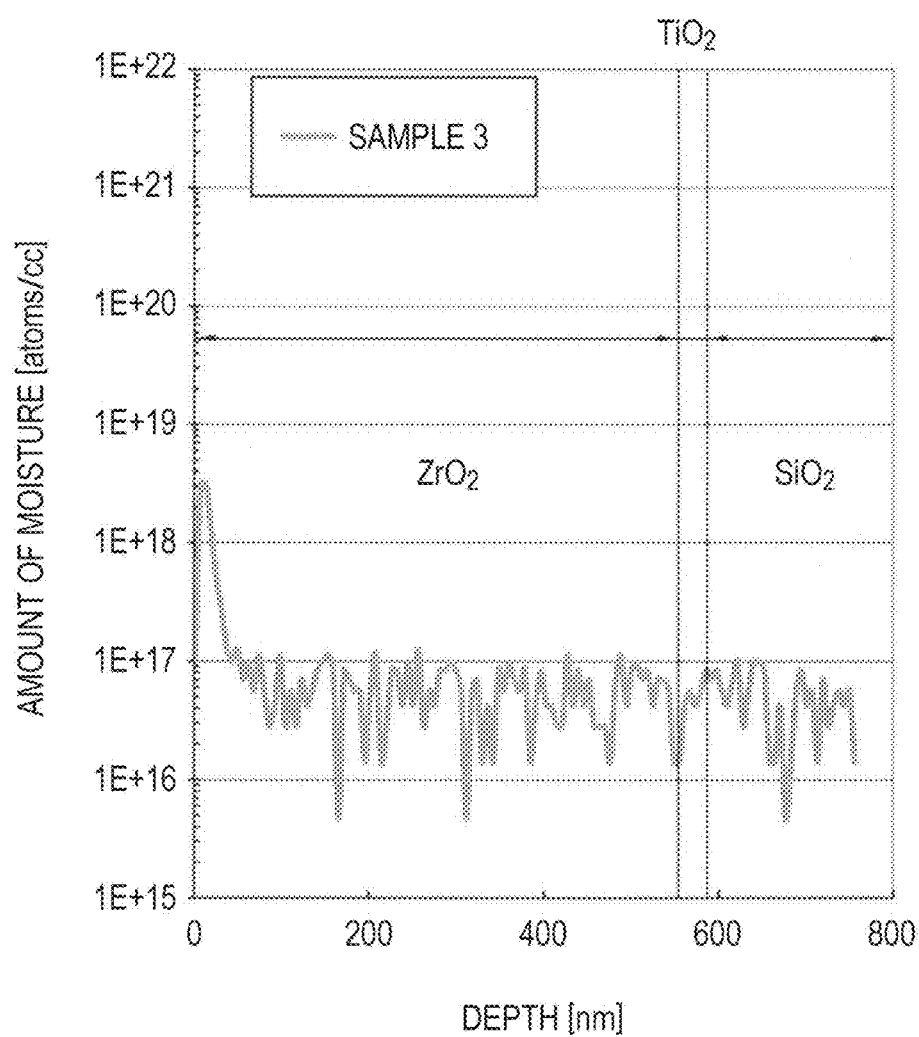
FIG. 13 is a graph illustrating an analysis result of Sample 3 by SIMS.

In addition, as illustrated in FIGS. 12 and 13, in Sample 2 and Sample 3, moisture did not invade the interface between the second layer 52 and the third layer 53 from the outside. On the other hand, as illustrated in FIG. 11, in Sample 1, moisture invaded between the first layer 51 and the third layer 53 from the outside. That is, in the diaphragm 50, moisture invades from the interface between the third layer 53 and the layer in the +Z direction from the third layer 53. This is referred to as a moisture invasion route R1.

In addition, from this result, by providing the second layer 52, it is possible to suppress the formation of the gap 400 at the interface between the second layer 52 and the third layer 53, and to suppress the invasion of moisture into the interface.

Sample 4

A piezoelectric actuator 300 having a first electrode 60 of platinum (Pt), a piezoelectric layer 70 of lead zirconate titanate (PZT; Pb (Zr, Ti) $O_3$), and a second electrode 80 of iridium (Ir) and titanium (Ti) was formed on the diaphragm 50 of Sample 1.

Test Example 2

Figure 14:
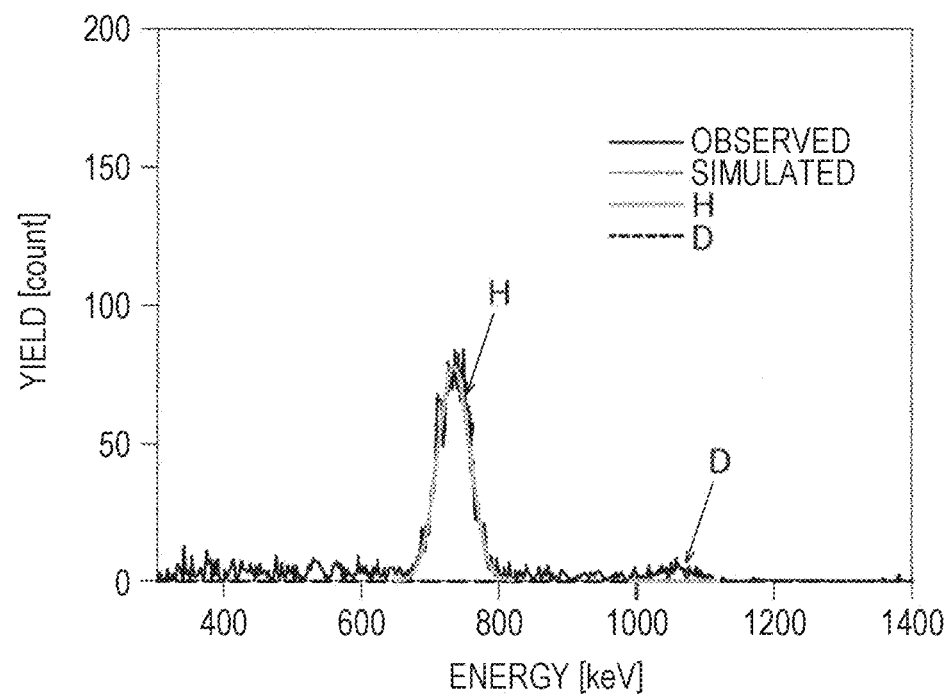
FIG. 14 is a graph illustrating an analysis result of Sample 4 by RBS.

Sample 4 was exposed to a water vapor content atmosphere of heavy water having a temperature of 45° C. and a humidity of 95% RH or higher for 24 hours or more, and analyzed by Rutherford backscattering spectroscopy (RBS). The result is illustrated in FIG. 14. In FIG. 14, H represents hydrogen and D represents deuterium.

As illustrated in FIG. 14, deuterium D was detected between the third layer 53 and the second electrode 80. Since deuterium is substantially non-existent in nature, it can be seen from the results illustrated in FIG. 14 that deuterium has invaded between the third layer 53 and the second electrode 80 from the outside. That is, in the diaphragm 50, moisture invades into the inside from the second electrode 80 side. The moisture invasion route from the diaphragm 50 on the second electrode 80 side can be considered to be both the interface between the third layer 53 and the layer on the third layer 53 on the −Z direction side on the end surface of the diaphragm 50 and the surface of the second electrode 80 in the −Z direction. The moisture invasion route from the interface between the third layer 53 and the layer on the third layer 53 on the −Z direction side is referred to as a moisture invasion route R2. In addition, the moisture invasion route from the surface side of the second electrode 80 of the third layer 53 in the −Z direction is referred to as a moisture invasion route R3.

Sample 5

Iridium and titanium were laminated in this order on the diaphragm 50 of Sample 1 to form a second electrode 80.

Sample 6

A fourth layer 200 made of titanium nitride was formed on the second electrode 80 of Sample 5.

Test Example 3

Sample 6 was exposed to a water vapor content atmosphere of heavy water having a temperature of 45° C. and a humidity of 95% RH or more for 24 hours or more, and analyzed by secondary ion mass spectrometry (SIMS). The result is illustrated in FIG. 15.

Figure 15:
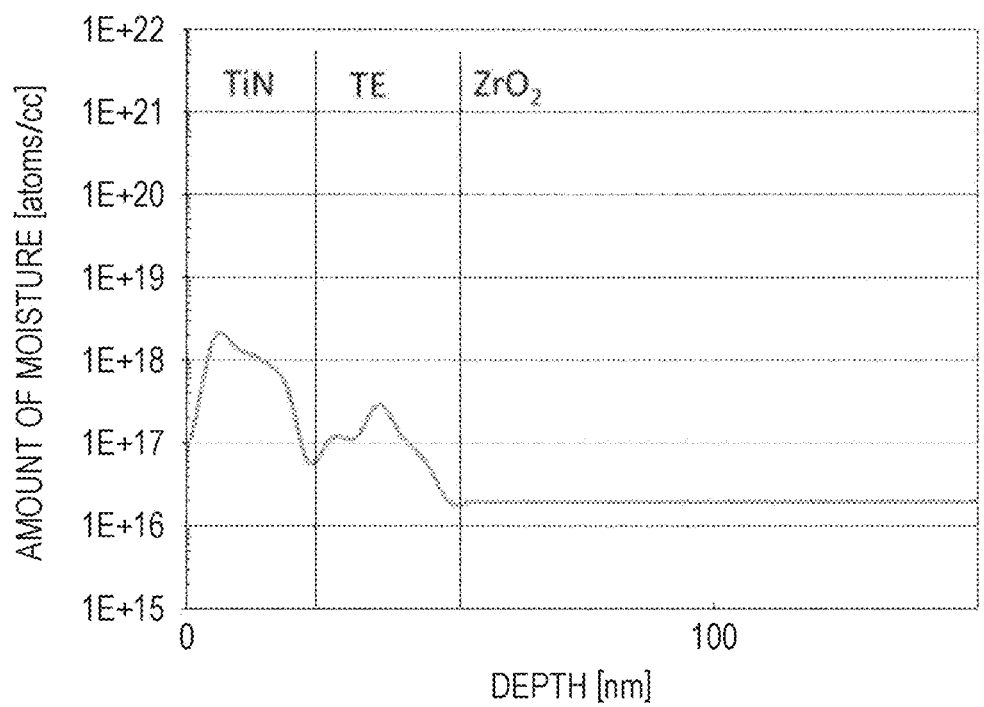
FIG. 15 is a graph illustrating an analysis result of Sample 6 by SIMS.

As illustrated in FIG. 15, the fourth layer 200 can suppress the invasion of moisture into the inside of the diaphragm 50, that is, the third layer 53.

Sample 7

A fourth layer 200 having a thickness of 10 nm made of iridium oxide was formed by a sputtering method on the diaphragm 50 of Sample 1.

Next, the same second electrode 80 as Sample 5 was formed on the fourth layer 200.

Sample 8

On the same diaphragm 50 and the second electrode 80 as Sample 5, a fourth layer 200 having a thickness of 30 nm made of aluminum oxide was formed by an atomic layer deposition method (ALD method).

Test Example 4

A scratch test was performed before and after immersing Sample 5, Sample 7, and Sample 8 in pure water for 30 minutes or more. The results are illustrated in Table 1 below.

TABLE 1

| | Scratch strength (mN) | | |
|---|---|---|---|
| | Before immersing in pure water | After immersing in pure water | Moisture invasion |
| Sample 5 | 20.9 | 9.1 | Present |
| Sample 7 | 19.8 | 20.7 | Absent |
| Sample 8 | 20.8 | 20.6 | Absent |

As illustrated in Table 1, in Sample 7 and Sample 8, no decrease in scratch strength was observed before and after being immersed in pure water. On the other hand, in Sample 5, after being immersed in pure water, the scratch strength is remarkably lowered, so that it is considered that the third layer 53 is embrittled due to moisture. When the scratch strength decreased by 5% or more before and after being immersed in pure water, it was determined that there was moisture invasion.

Based on the results of these Test Examples 1 to 4, a comprehensive evaluation was performed on the structures of Embodiments 1 to 2 and the structure of Comparative Examples 1 to 4 to be compared with the structures of Embodiments 1 to 2. FIGS. 16 to 19 and Table 2 below illustrate the structure of Comparative Examples 1 to 4.

Figure 16:
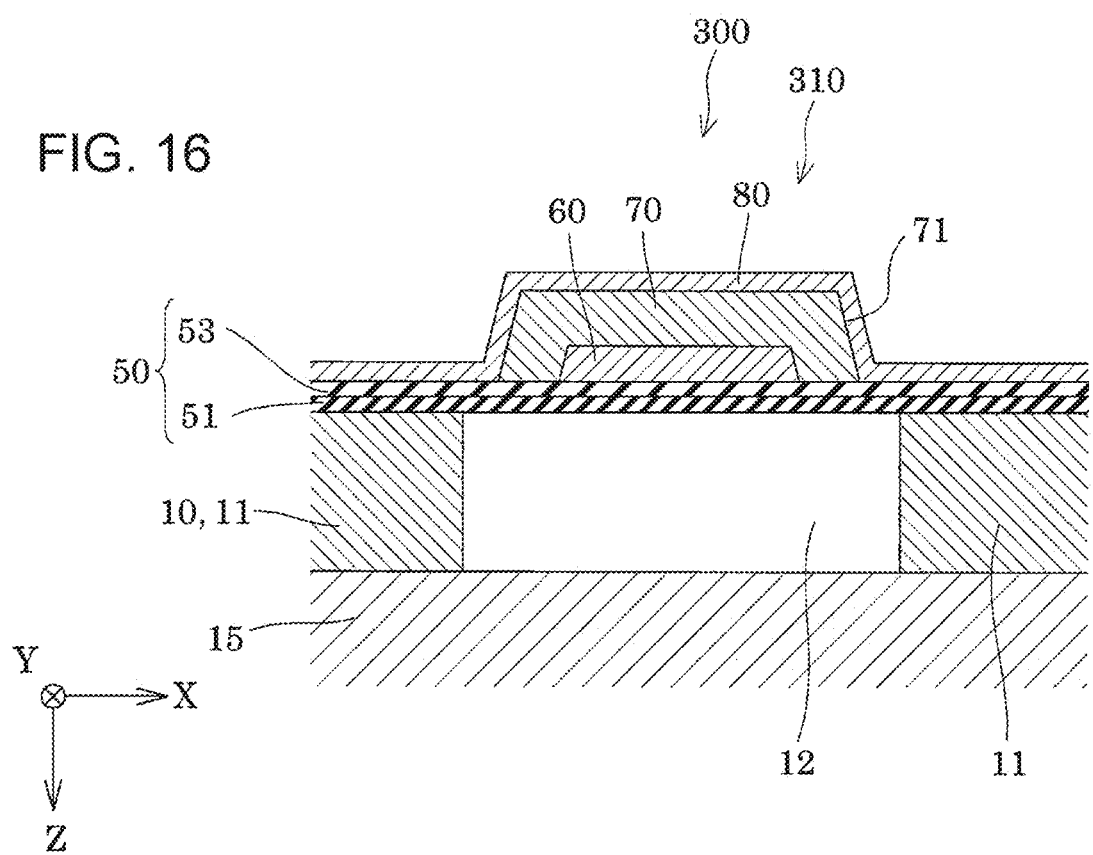
FIG. 16 is a cross-sectional view of Comparative Example 1.

As illustrated in FIG. 16, Comparative Example 1 has a structure in which the second layer 52 and the fourth layer 200 are not provided.

Figure 17:
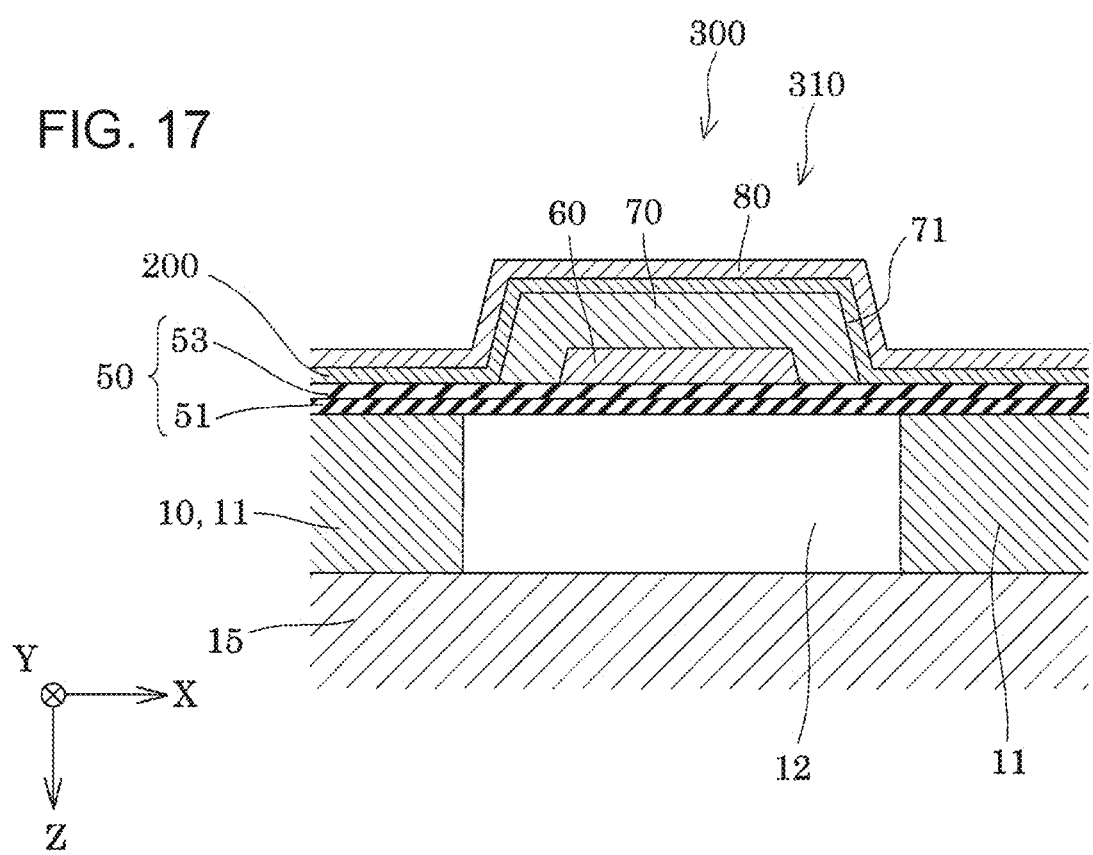
FIG. 17 is a cross-sectional view of Comparative Example 2.

As illustrated in FIG. 17, Comparative Example 2 has a structure in which the second layer 52 is not provided and only the fourth layer 200 of Embodiment 1 is provided.

Figure 18:
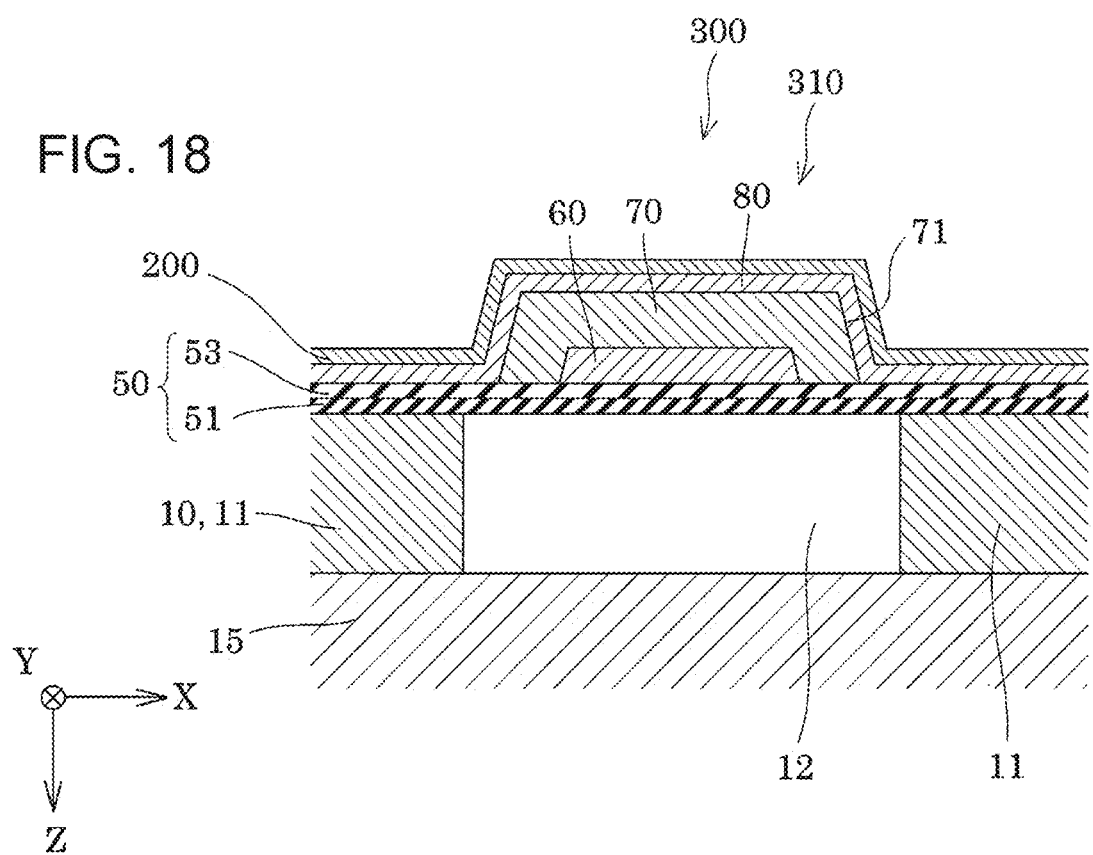
FIG. 18 is a cross-sectional view of Comparative Example 3.

As illustrated in FIG. 18, Comparative Example 3 has a structure in which the second layer 52 is not provided and only the fourth layer 200 of Embodiment 2 is provided.

Figure 19:
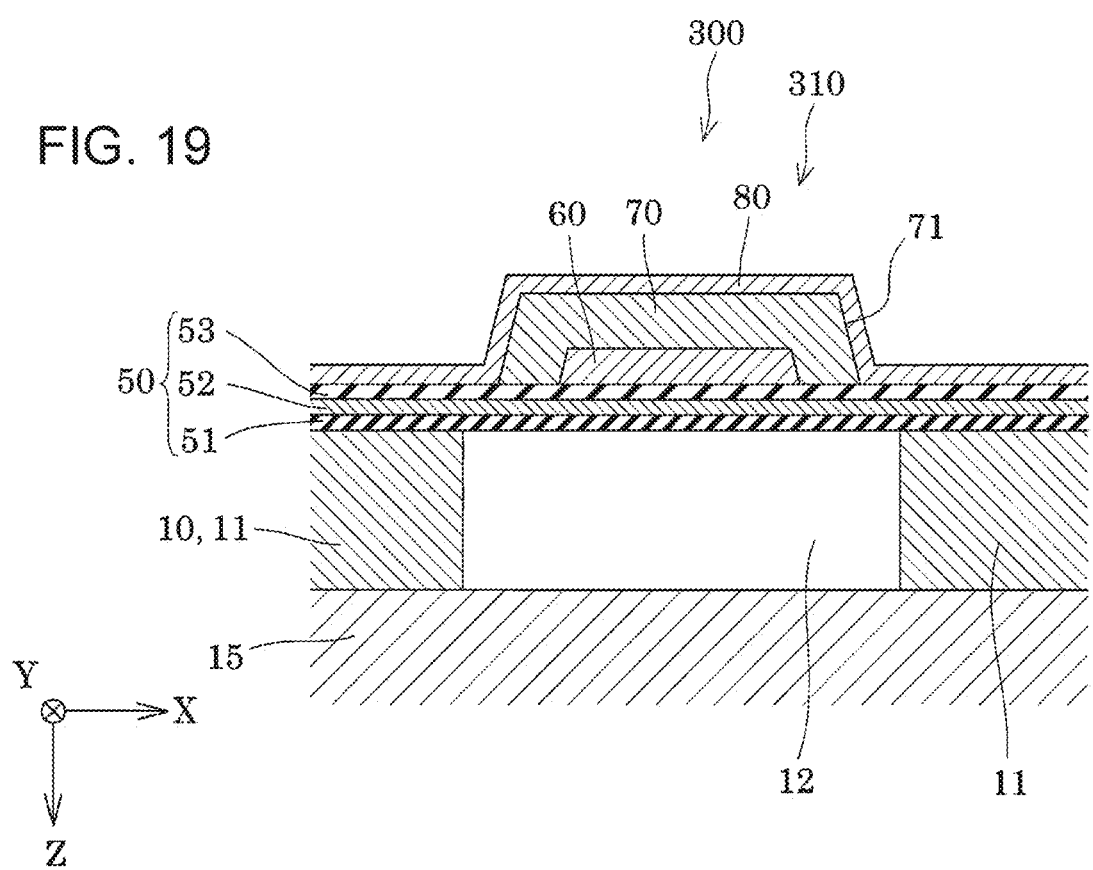
FIG. 19 is a cross-sectional view of Comparative Example 4.

As illustrated in FIG. 19, Comparative Example 4 has a structure in which the fourth layer 200 is not provided and the second layer 52 is provided.

TABLE 2

| | Structure | | Moisture invasion verification | | |
|---|---|---|---|---|---|
| | Second layer | Fourth layer | R1 | R2, R3 | Comprehensive determination |
| Comparative Example 1 | Absent | Absent | Invasion | Invasion | D |
| Comparative Example 2 | Absent | Present | Invasion | No invasion | D |
| Comparative Example 3 | Absent | Present | Invasion | No invasion | D |
| Comparative Example 4 | Present | Absent | No invasion | Invasion | C |
| Embodiment 1 | Present | Present | No invasion | No invasion | B |
| Embodiment 2 | Present | Present | No invasion | No invasion | B |

As illustrated in Table 2, in the structure provided with the second layer 52 and the fourth layer 200 of Embodiments 1 and 2, it is possible to suppress the invasion of moisture into the inside of the diaphragm 50 and suppress the embrittlement of the third layer 53 due to the invaded moisture. Therefore, delamination between the third layer 53 and the upper and lower layers of the third layer 53 and cracks in the diaphragm 50 can be suppressed. Since the moisture invasion route R1 is easier for moisture to invade than the moisture invasion routes R2 and R3, the structure of Comparative Example 4 can suppress the invasion of moisture as compared with the structure of Comparative Example 1. Therefore, the structure of Comparative Example 4 can suppress delamination, cracks, and the like of the diaphragm 50 as compared with Comparative Examples 1 to 3.

In addition, it is preferable that the valences of the second layer 52 and the third layer 53 are the same. Here, the fact that the valences of the second layer 52 and the third layer 53 are the same means that the difference X between the valences of the main constituent elements of the second layer 52 and the valences of the main constituent elements of the third layer 53 is within the range of $-0.5 \leq X \leq +0.5$. By making the valences of the second layer 52 and the third layer 53 the same in this manner, since the insulating property of the entire diaphragm 50 is improved, it is possible to suppress a leak current between a plurality of active portions 310 of the piezoelectric actuator 300. Therefore, it is possible to suppress the leak current and reduce the decrease in displacement of the active portion 310 due to the leak current.

For example, when the third layer 53 is made of the +4 valences of zirconium oxide ($ZrO_2$), as the constituent elements of the second layer 52, it is preferable to use titanium, hafnium, iridium, and the like, which have the same +4 valences and are stable.

In addition, it is preferable that the valences between the second layer 52 and the third layer 53 are different. Here, the fact that the valences between the second layer 52 and the third layer 53 are different means that the difference X between the valences of the main constituent elements of the second layer 52 and the valences of the main constituent elements of the third layer 53 is within the range of $X < -0.5$, $+0.5 \leq X$. That is, when the constituent element of the second layer 52 has +4 valences, the constituent element of the third layer 53 has preferably smaller than +3.5 valences or +4.5 valences or more.

As described above, by making the valences of the second layer 52 and the third layer 53 different, the constituent elements of the second layer 52 can easily move to the third layer 53 on the −Z direction side. Therefore, when the active portion 310 is selectively driven, by generating a leak current in the other active portion 310 that is not driven and passing a minute current, it is possible to suppress deterioration variation between the active portion 310 that is continued to move and the other active portion 310 that does not move. Therefore, it is possible to suppress variations in the decrease in displacement of the plurality of active portions 310, suppress variations in the ejection characteristics of ink droplets, and improve the print quality.

For example, when the third layer 53 is made of the +4 valences of zirconium oxide ($ZrO_2$), as the constituent element of the second layer 52, it is preferable to use chromium, aluminum, tantalum or the like having a valence different from that of the third layer 53.

Sample 9

By thermally oxidizing one surface of the silicon single crystal substrate having the plane orientation (110), the first layer 51 having a thickness of 1460 nm made of silicon oxide was formed.

Next, a film made of zirconium was formed on the first layer 51 by a sputtering method, and the film was thermally oxidized at 900° C. to form a third layer 53 having a thickness of 400 nm made of zirconium oxide. As a result, the diaphragm 50 including the first layer 51 and the third layer 53 was formed.

Next, the first electrode 60, the piezoelectric layer 70, and the second electrode 80 were formed and patterned on the diaphragm 50 to form a piezoelectric actuator 300 having the same shape as that of Embodiment 1.

Thereafter, the other surface of the silicon single crystal substrate was anisotropically etched using a potassium hydroxide aqueous solution (KOH) or the like as an etching solution to form a recessed portion having the first layer 51 as the bottom surface.

Sample 10

The third layer 53 was the same as that of Sample 9 except that the thickness was set to 645 nm.

Sample 11

A film made of titanium was formed on the first layer 51 of Sample 9 by a sputtering method, and the film was thermally oxidized to form a second layer 52 having a thickness of 40 nm made of titanium oxide.

In addition, the third layer 53 formed on the second layer 52 was the same as that of Sample 9 described above except that the thickness was set to 250 nm.

Sample 12

A film made of chromium was formed on the first layer 51 of Sample 9 by a sputtering method, and the film was thermally oxidized to form a second layer 52 having a thickness of 40 nm made of chromium oxide.

In addition, the third layer 53 formed on the second layer 52 was the same as that of Sample 9 described above except that the thickness was set to 500 nm.

Sample 13

The third layer 53 was the same as that of Sample 12 described above except that the thickness was set to 250 nm.

Test Example 5

Figure 20:
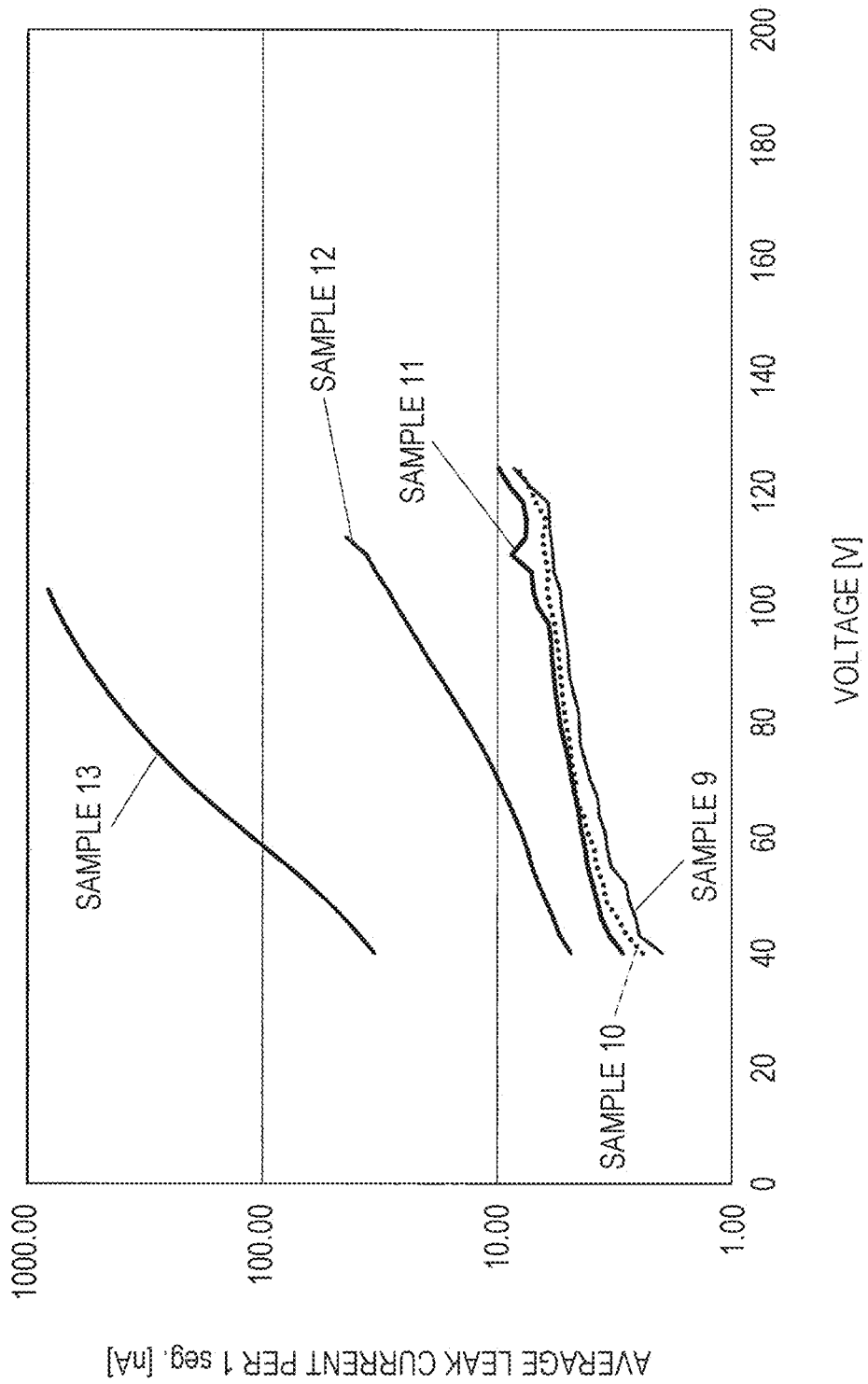
FIG. 20 is a graph illustrating a result of leak current.

A withstand voltage test described later was performed on a plurality of active portions of each of the piezoelectric actuators of Samples 9 to 13 to obtain an average value. The results are illustrated in FIG. 20 and Table 3 below.

In the withstand voltage test, the voltage applied between the first electrode 60 and the second electrode 80 is changed from 40 V to 180 V, and when the leak current exceeds 1000 nA, the voltage application is stopped. The voltage exceeding 1000 nA is defined as "withstand voltage".

TABLE 3

| | Film configuration | Leak current (relative ratio) | Drive other active portion with slight vibration |
|---|---|---|---|
| Sample 9 | $ZrO_2$ (400 nm)/$SiO_2$ | 1 | Absent |
| Sample 10 | $ZrO_2$ (645 nm)/$SiO_2$ | Approximately 1.2 | Absent |
| Sample 11 | $ZrO_2$ (250 nm)/$TiO_2$/$SiO_2$ | Approximately 1.5 | Absent |
| Sample 12 | $ZrO_2$ (500 nm)/$CrO_x$/$SiO_2$ | 2 to 6 | Present |
| Sample 13 | $ZrO_2$ (250 nm)/$CrO_x$/$SiO_2$ | 10 to 100 | Present |

From the results illustrated in FIG. 20 and Table 3, by aligning the valences of the third layer 53 and the second layer 52 as in Sample 11, the insulating property of the diaphragm 50 is improved, and the leak current between the plurality of active portions 310 can be suppressed.

In addition, by making the valences of the third layer 53 and the second layer 52 different as in Samples 12 and 13, the leak current can be increased to drive the other active portion 310 with a slight vibration.

As described above, the recording head 2, which is an example of the piezoelectric device of the present disclosure, includes the flow path formation substrate 10 which is a substrate having the pressure chamber 12 as the recessed portion, the diaphragm 50, and the piezoelectric actuator 300. The flow path formation substrate 10, the diaphragm 50, and the piezoelectric actuator 300 are laminated in this order in the −Z direction as the first direction. In addition, the diaphragm 50 includes the first layer 51 containing silicon as a constituent element. In addition, the diaphragm 50 includes the second layer 52 disposed between the first layer 51 and the piezoelectric actuator 300, and containing any one or both of at least one metal element selected from the group consisting of chromium, titanium, aluminum, tantalum, hafnium, and iridium, and silicon nitride, as a constituent element. In addition, the diaphragm 50 is disposed between the second layer 52 and the piezoelectric actuator 300, and includes the third layer 53 containing zirconium as a constituent element. On the third layer 53 on the piezoelectric actuator 300 side, the fourth layer 200 containing any one or both of at least one metal element selected from the group consisting of chromium, titanium, aluminum, tantalum, hafnium, and iridium, and silicon nitride, as a constituent element is provided.

By providing the second layer 52 in this manner, it is possible to suppress the formation of voids at the interface of the third layer 53 on the first layer 51 side, and to suppress the invasion of moisture from the interface of the third layer 53 on the first layer 51 side. In addition, by providing the fourth layer 200, it is possible to suppress the invasion of moisture from the third layer 53 on the piezoelectric actuator 300 side. Therefore, it is possible to suppress the embrittlement of the third layer 53 due to moisture, and to suppress delamination of the diaphragm 50 and breakage such as cracks.

In addition, in the recording head 2 of the present embodiment, it is preferable that the second layer 52 and the fourth layer 200 contain at least one metal element selected from the group consisting of chromium, titanium, and aluminum.

Accordingly, the second layer 52 and the fourth layer 200 contain a metal element that is more easily oxidized than zirconium, so that the reduction of the silicon oxide contained in the first layer 51 can be reduced as compared with the configuration in which the metal element contained in the second layer 52 is more easily oxidized than zirconium. As a result, the adhesion between the first layer 51 and the third layer 53 can be enhanced as compared with the configuration in which the second layer 52 is not used. In addition, the adhesion between the third layer 53 and the fourth layer 200 can be enhanced.

In addition, in the recording head 2 of the present embodiment, the piezoelectric actuator 300 includes the first electrode 60, the piezoelectric layer 70, and the second electrode 80, and the first electrode 60, the piezoelectric layer 70, and the second electrode 80 are laminated in this order in the −Z direction, which is the first direction. It is preferable that the first electrode 60 and the piezoelectric layer 70 are interposed between the third layer 53 and the fourth layer 200 from the third layer 53 side. As described above, by preventing the second electrode 80 from being interposed between the fourth layer 200 and the third layer 53, the fourth layer 200 can be brought into contact with the third layer 53 on the second electrode 80 side. Therefore, it is possible to suppress the invasion of moisture from the interface of the third layer 53 on the second electrode 80 side. In addition, by interposing the piezoelectric layer 70 between the second layer 52 and the fourth layer 200, the piezoelectric layer 70 can be protected from moisture and hydrogen. In addition, by not providing the fourth layer 200 on the piezoelectric layer 70 on the diaphragm 50 side, it is possible to suppress the crystal structure of the piezoelectric layer 70 from being disturbed by the fourth layer 200, and to control the crystal structure of the piezoelectric layer 70 by the third layer 53.

In addition, in the recording head 2 of the present embodiment, the piezoelectric actuator 300 includes the first electrode 60, the piezoelectric layer 70, and the second electrode 80, and the first electrode 60, the piezoelectric layer 70, and the second electrode 80 are laminated in this order in the −Z direction, which is the first direction. It is preferable that the first electrode 60, the piezoelectric layer 70, and the second electrode 80 are interposed between the third layer 53 and the fourth layer 200 from the third layer 53 side. Even when the second electrode 80 is interposed between the third layer 53 and the fourth layer 200, the fourth layer 200 can suppress the invasion of moisture from the third layer 53 on the second electrode 80 side of the diaphragm 50. In addition, by interposing the piezoelectric layer 70 between the second layer 52 and the fourth layer 200, the piezoelectric layer 70 can be protected from moisture and hydrogen. In addition, by not providing the fourth layer 200 on the piezoelectric layer 70 on the diaphragm 50 side, it is possible to suppress the crystal structure of the piezoelectric layer 70 from being disturbed by the fourth layer 200, and to control the crystal structure of the piezoelectric layer 70 by the third layer 53.

In addition, in the recording head 2 of the present embodiment, it is preferable that the second layer 52 and the fourth layer 200 cover the pressure chamber 12, which is a recessed portion, in a plan view in the +Z direction, which is a direction opposite to the −Z direction as the first direction. Accordingly, in the flexible portion of the diaphragm 50 facing the pressure chamber 12, it is possible to reliably suppress delamination of the diaphragm 50 and breakage such as cracks.

In addition, in the recording head 2 of the present embodiment, it is preferable that the second layer 52 and the fourth layer 200 have the same material as each other. Accordingly, by using the same material for the second layer 52 and the fourth layer 200, it is possible to reduce the types of materials and reduce the cost as compared with the case where different materials are used.

In addition, in the recording head 2 of the present embodiment, it is preferable that the thickness T2 of the second layer 52 is thicker than the thickness T4 of the fourth layer 200. Since moisture is likely to invade the diaphragm 50, especially from the second layer 52 side, the thickness T2 of the second layer 52 is made thicker than the thickness T4 of the fourth layer 200. Therefore, it is possible to efficiently reduce the invasion of moisture into the inside of the diaphragm 50.

In addition, in the recording head 2 of the present embodiment, it is preferable that the second layer 52 and the third layer 53 have different valences from each other. Accordingly, when the active portion 310 is selectively driven, by generating a leak current in the other active portion 310 that is not driven and passing a minute current, it is possible to suppress deterioration variation between the active portion 310 that is continued to move and the other active portion 310 that does not move. Therefore, it is possible to suppress variations in the decrease in displacement of the plurality of active portions 310, suppress variations in the ejection characteristics of ink droplets, and improve the print quality.

In addition, in the recording head 2 of the present embodiment, it is preferable that the second layer 52 and the third layer 53 have the same valence as each other. Accordingly, the insulating property of the diaphragm 50 can be improved, the leak current can be suppressed, and the decrease in displacement of the active portion 310 can be suppressed.

In addition, in the recording head 2 of the present embodiment, it is preferable that the first layer 51 contains silicon oxide and the third layer 53 contains zirconium oxide. Accordingly, the pressure chamber 12 can be formed with high accuracy by etching on the flow path formation substrate 10 by using the first layer 51 as an etching stop layer. In addition, the crystal structure of the piezoelectric layer 70 can be controlled by the surface state of the third layer 53.

In addition, in the recording head 2 of the present embodiment, it is preferable that the second layer 52 contains chromium oxide. As described above, since the second layer 52 contains chromium oxide, the adhesion between the second layer 52 and the third layer 53 can be improved and the formation of voids at the interface can be suppressed.

In addition, in the recording head 2 of the present embodiment, it is preferable that the chromium oxide contained in the second layer 52 has an amorphous structure. Accordingly, the compressive stress which is the internal stress of the second layer 52 can be reduced, and the strain generated at the interface with the first layer 51 or the third layer 53 can be reduced.

In addition, in the recording head 2 of the present embodiment, it is preferable that the fourth layer 200 contains chromium oxide. As described above, since the fourth layer 200 contains chromium oxide, the adhesion between the fourth layer 200 and the third layer 53 or the second electrode 80 can be improved and the formation of voids at the interface can be suppressed.

In addition, in the recording head 2 of the present embodiment, it is preferable that the chromium oxide contained in the fourth layer 200 has an amorphous structure. Accordingly, the compressive stress which is the internal stress of the fourth layer 200 can be reduced, and the strain generated at the interface with the fourth layer 200 and the third layer 53 can be reduced.

In addition, in the recording head 2 of the present embodiment, it is preferable that the second layer 52 contains titanium oxide. As described above, since the second layer 52 contains titanium oxide, the adhesion between the second layer 52 and the third layer 53 can be improved and the formation of voids at the interface can be suppressed.

In addition, in the recording head 2 of the present embodiment, it is preferable that the titanium oxide contained in the second layer 52 has a rutile structure. As described above, since the titanium oxide contained in the second layer 52 has a rutile structure, the thermal stability of the second layer 52 can be improved as compared with the case where the crystal structure of titanium oxide contained in the second layer 52 has another crystal structure.

In addition, in the recording head 2 of the present embodiment, it is preferable that the fourth layer 200 contains titanium oxide. As described above, since the fourth layer 200 contains titanium oxide, the adhesion between the fourth layer 200 and the third layer 53 or the second electrode 80 can be improved and the formation of voids at the interface can be suppressed.

In addition, in the recording head 2 of the present embodiment, it is preferable that the titanium oxide contained in the fourth layer 200 has a rutile structure. As described above, since the titanium oxide contained in the fourth layer 200 has a rutile structure, the thermal stability of the fourth layer 200 can be improved as compared with the case where the crystal structure of titanium oxide contained in the fourth layer 200 has another crystal structure.

In addition, in the recording head 2 of the present embodiment, it is preferable that the second layer 52 contains aluminum oxide. As described above, since the second layer 52 contains aluminum oxide, the adhesion between the second layer 52 and the third layer 53 can be improved and the formation of voids at the interface can be suppressed.

In addition, in the recording head 2 of the present embodiment, it is preferable that the aluminum oxide contained in the second layer 52 has an amorphous structure or a trigonal crystal system structure. As described above, aluminum oxide has an amorphous structure or a trigonal crystal system structure, so that it is a dense film and is hard to crack.

In addition, in the recording head 2 of the present embodiment, it is preferable that the fourth layer 200 contains aluminum oxide. As described above, since the fourth layer 200 contains aluminum oxide, the adhesion between the fourth layer 200 and the third layer 53 can be improved and the formation of voids at the interface can be suppressed.

In addition, in the recording head 2 of the present embodiment, it is preferable that the aluminum oxide contained in the fourth layer 200 has an amorphous structure or a trigonal crystal system structure. As described above, aluminum oxide has an amorphous structure or a trigonal crystal system structure, so that it is a dense film and is hard to crack.

In addition, in the recording head 2 of the present embodiment, it is preferable that the thickness T2 of the second layer 52 is thinner than the thicknesses T1 and T3 of each of the first layer 51 and the third layer 53. As described above, by making the thickness T2 of the second layer 52 thinner than the thickness T1 of the first layer 51 and the thickness T3 of the third layer 53, it is likely to optimize the characteristics of the diaphragm 50.

In addition, in the recording head 2 of the present embodiment, the thickness T2 of the second layer 52 is preferably in the range of 20 nm or more and 50 nm or less. When the thickness T2 of the second layer 52 is too thin, depending on the heat treatment conditions at the time of manufacture, there is a possibility that the silicon alone diffused from the first layer 51 to the second layer 52 may reach the third layer 53, and a void may be formed between the second layer 52 and the third layer 53. In addition, when the thickness T2 of the second layer 52 is too thick, the heat treatment when manufacturing the second layer 52 may not be sufficiently performed, and as a result of the long time required for the thermal oxidation, the other layers may be adversely affected. By setting the thickness T2 of the second layer 52 within the above range, it is possible to suppress the diffusion of silicon in the third layer 53 to suppress the formation of voids, and to perform the heat treatment of the second layer 52 in a relatively short time.

In addition, in the recording head 2 of the present embodiment, it is preferable that each of the second layer 52 and the third layer 53 contains impurities. Since the second layer 52 contains impurities, the diffusion of silicon from the first layer 51 to the second layer 52 is reduced, or even when silicon diffuses from the first layer 51 to the second layer 52, it is possible to reduce the diffusion of the silicon into the third layer 53. In addition, since the third layer 53 contains impurities, the third layer 53 can be softened.

In addition, in the recording head 2 of the present embodiment, the content of impurities in the second layer 52 is preferably higher than the content of impurities in the third layer 53. In this case, the formation of a gap at the interface between the second layer 52 and the third layer 53 or in the third layer 53 is reduced.

The ink jet recording device 1 which is an example of the liquid ejecting apparatus of the present disclosure includes the recording head 2 described above. It is possible to achieve an ink jet recording device 1 that suppresses delamination of the diaphragm 50 and breakage such as cracks and the like to suppress a decrease in life.

Other Embodiments

Although each embodiment of the present disclosure has been described above, the basic configuration of the present disclosure is not limited to the above embodiment.

Figure 21:
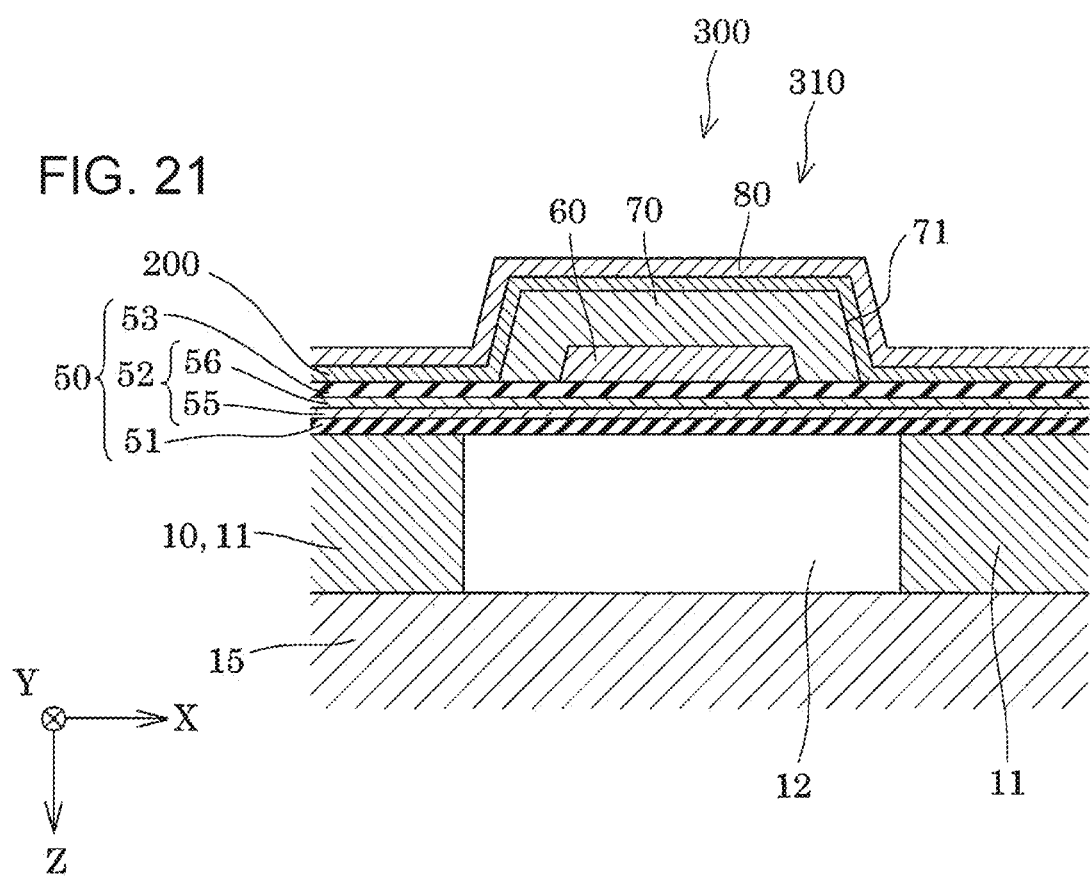
FIG. 21 is a cross-sectional view illustrating a modified example of Embodiment 1.

Here, a modified example of Embodiment 1 is illustrated in FIG. 21. As illustrated in FIG. 21, the diaphragm 50 includes the first layer 51, the second layer 52, and the third layer 53. The second layer 52 includes a layer 55 and a layer 56. The layer 55 and the layer 56 are laminated in this order in the −Z direction. Each of the layer 55 and the layer 56 is a layer containing the same constituent elements as the second layer 52 described above. However, the compositions of the materials constituting the layer 55 and the layer 56 are different from each other. Specifically, the types or contents of impurities in the layer 55 and the layer 56 are different from each other. The impurity is an element such as titanium (Ti), silicon (Si), iron (Fe), chromium (Cr) or hafnium (Hf), as in Embodiment 1 described above. For example, such a layer 55 and a layer 56 are formed by forming a layer made of a simple substance of the metal element by a sputtering method or the like, and adjusting the time or temperature of the heat treatment, so that the distribution of impurities in the thickness direction differs with respect to the layer. The formation of these layers is not particularly limited, and each layer may be formed by individual film formation by, for example, a CVD method or the like.

When silicon is contained as an impurity in the layer 56, the layer 56 can be regarded as a "second layer", and in this case, the layer 55 can be regarded as a "fourth layer". That is, the layer 55 is disposed between the first layer 51 and the layer 56, and contains the element and silicon contained in the layer 56. As described above, since the layer 55 contains silicon, the diffusion of silicon from the first layer 51 to the second layer 52 is reduced, or even when silicon diffuses from the first layer 51 to the second layer 52, it is possible to reduce the diffusion of the silicon into the third layer 53. In addition, there is also an effect that a gap is unlikely to be generated at the interface between the first layer 51 and the second layer 52.

Here, the layer 56 may contain silicon, and the silicon content in the layer 55 is preferably higher than the silicon content in the layer 56. In other words, the silicon content in the layer 56 is preferably lower than the silicon content in the layer 55. By making the relationship of the silicon content in the layer 55 and the layer 56 in this manner, for example, when the layer 55 contains titanium oxide, the crystal strain of the titanium oxide in the layer 55 due to silicon can be reduced. In addition, by lowering the silicon content in the layer 56, the adhesion between the layer 56 and the third layer 53 can be enhanced.

In addition, since the layer 56 contains zirconium as an impurity, the diffusion of zirconium from the third layer 53 to the layer 55 is reduced, or even when zirconium diffuses from the third layer 53 to the layer 55, it is possible to reduce the diffusion of the zirconium to the first layer 51. In addition, there is also an effect that a gap is unlikely to be generated at the interface between the third layer 53 and the layer 55.

Even with such a configuration, as in Embodiment 1, it is possible to suppress the invasion of moisture into the inside of the diaphragm, in particular, the invasion of moisture from the moisture invasion route R1, and to suppress delamination and cracks of the diaphragm 50. As a matter of course, the second layer 52 having such a layer 55 and a layer 56 may be applied to Embodiment 2.

In the recording head 2, which is an example of the piezoelectric device illustrated in FIG. 21, the diaphragm 50 further includes a layer 55 as a fifth layer provided between the first layer 51 and the layer 56 as the second layer, and containing the element contained in the layer 56 and silicon as constituent elements.

In addition, in the recording head 2 illustrated in FIG. 21, it is preferable that the layer 56 which is the second layer further contains silicon as a constituent element, and the silicon content in the layer 55 which is the fourth layer is higher than the silicon content in the layer 56. As described above, by providing the layer 55 which is the fourth layer and setting the silicon content in the layer 55 and the layer 56 as described above, it is difficult for a gap to occur at the interface between the second layer 52 and the third layer 53.

Figure 22:
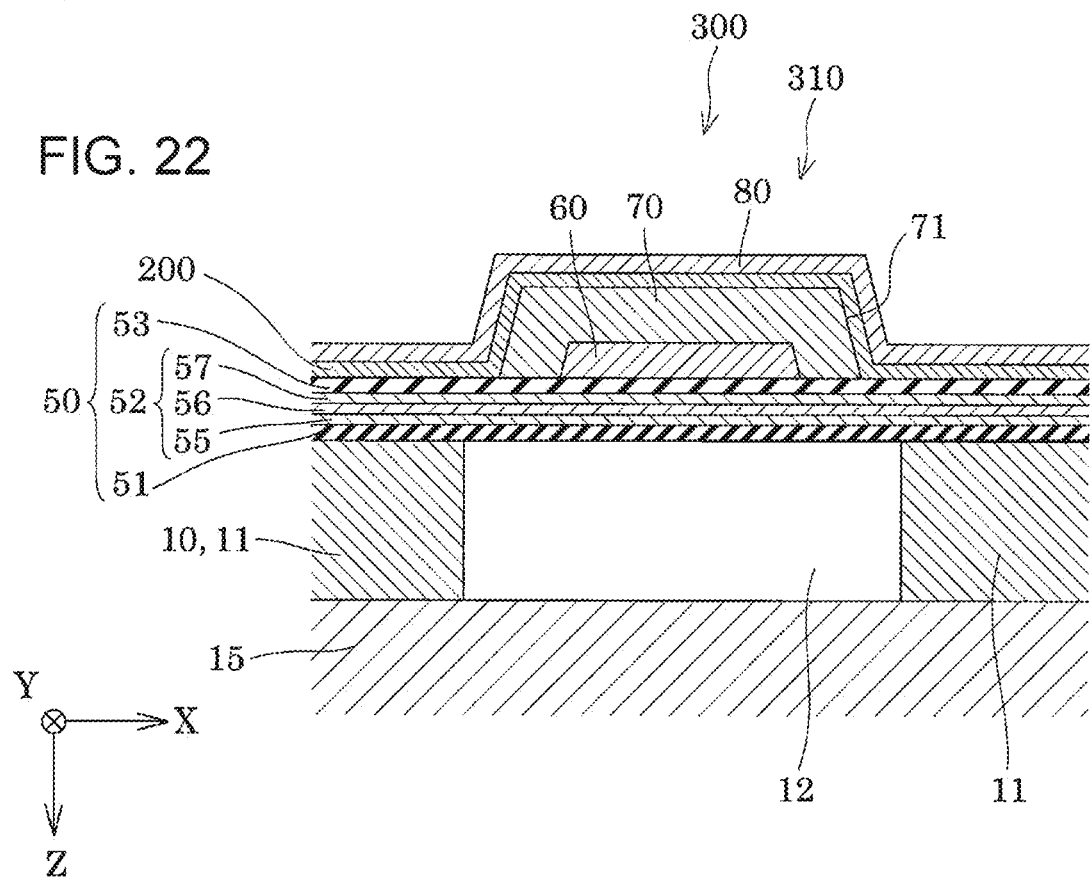
FIG. 22 is a cross-sectional view illustrating the modified example of Embodiment 1.

In addition, a modified example of Embodiment 1 is illustrated in FIG. 22. As illustrated in FIG. 22, the diaphragm 50 includes the first layer 51, the second layer 52, and the third layer 53. The second layer 52 includes a layer 55, a layer 56, and a layer 57. The layer 55, the layer 56, and the layer 57 are laminated in this order in the −Z direction. Each of the layer 55, the layer 56, and the layer 57 is a layer containing the same constituent elements as the second layer 52 described above.

However, the compositions of the materials constituting the layer 55, the layer 56, and the layer 57 are different from each other. Specifically, the types or contents of impurities in the layers 55, 56, and 57 are different from each other. The impurity is an element such as titanium (Ti), silicon (Si), iron (Fe), chromium (Cr) or hafnium (Hf), as in Embodiment 1 described above. For example, such a layer 55, a layer 56, and a layer 57 are formed by forming a layer made of a simple substance of the metal element by a sputtering method or the like, and adjusting the time or temperature of the heat treatment, so that the distribution of impurities in the thickness direction differs with respect to the layer. The formation of these layers is not particularly limited, and each layer may be formed by individual film formation by, for example, a CVD method or the like.

In addition, when the layer 57 contains zirconium as an impurity, the layer 56 can be regarded as a "second layer", and in this case, the layer 57 can be regarded as a "fifth layer". That is, the layer 57 is disposed between the layer 56 and the third layer 53, and contains the elements contained in the layer 56 and zirconium. As described above, since the layer 57 contains zirconium, the diffusion of zirconium from the third layer 53 to the second layer 52 is reduced, or even when zirconium diffuses from the third layer 53 to the second layer 52, it is possible to reduce the diffusion of the zirconium to the first layer 51. In addition, there is also an effect that a gap is unlikely to be generated at the interface between the third layer 53 and the second layer 52.

Even with such a configuration, as in Embodiment 1, it is possible to suppress the invasion of moisture into the inside of the diaphragm, in particular, the invasion of moisture from the moisture invasion route R1, and to suppress delamination and cracks of the diaphragm 50. As a matter of course, the second layer 52 having such a layer 55, a layer 56 and a layer 57 may be applied to Embodiment 2.

In the recording head 2, which is an example of the piezoelectric device illustrated in FIG. 22, the diaphragm 50 further includes a layer 57 as a fifth layer provided between the layer 56 as the second layer and the third layer 53, and containing the element contained in the layer 56 and silicon as constituent elements. As described above, by providing the layer 57, it is difficult for a gap to occur at the interface between the second layer 52 and the third layer 53.

For example, in each of the embodiments described above, the first electrode 60 is an individual electrode of the piezoelectric actuator 300, and the second electrode 80 is a common electrode of the plurality of piezoelectric actuators 300, and the present disclosure is not particularly limited thereto. The first electrode 60 may be a common electrode of the plurality of piezoelectric actuators 300, and the second electrode 80 may be an individual electrode of each piezoelectric actuator 300.

In addition, in the ink jet recording device 1 described above, an example is described in which the recording head 2 is mounted on the transport body 7 and reciprocates along the X axis, which is the main scanning direction, and the present disclosure is not particularly limited thereto. For example, the present disclosure can also be applied to a so-called line-type recording device in which a recording head 2 is fixed and printing is performed by simply moving a medium S such as paper along the Y axis, which is the sub-scanning direction.

In the above embodiment, the ink jet recording head is described as an example of a liquid ejecting head, and the ink jet recording device is described as an example of a liquid ejecting apparatus. The present disclosure is broadly intended for the liquid ejecting head and the liquid ejecting apparatus in general, and can of course be applied to a liquid ejecting head and a liquid ejecting apparatus that eject liquids other than ink. Examples of other liquid ejecting heads include various recording heads used in an image recording device such as a printer, a color material ejecting head used in the manufacture of a color filter such as a liquid crystal display, an electrode material ejecting head used for electrode formation such as an organic EL display and field emission display (FED), a bioorganic substance ejecting head used in biochip manufacturing, and the like. The present disclosure can also be applied to a liquid ejecting apparatus provided with such a liquid ejecting head.

In addition, the present disclosure is not limited to the liquid ejecting head represented by the ink jet recording head, and can be applied to a piezoelectric device such as an ultrasonic device, a motor, a pressure sensor, a pyroelectric element, and a ferroelectric element. In addition, a finished body using these piezoelectric devices, for example, a liquid ejecting apparatus using a liquid ejecting head, an ultrasonic sensor using an ultrasonic device, a robot using a motor as a drive source, an IR sensor using the above pyroelectric element, a ferroelectric memory using a ferroelectric element, and the like are also included in the piezoelectric device.

What is claimed is:

1. A piezoelectric device comprising:
   a substrate having a recessed portion;
   a diaphragm; and
   a piezoelectric actuator includes a first electrode, a piezoelectric layer, and a second electrode that are laminated in this order in a first direction, wherein
   the substrate, the diaphragm, and the piezoelectric actuator are laminated in this order in the first direction,
   the diaphragm includes
      a first layer containing silicon as a constituent element,
      a second layer disposed between the first layer and the piezoelectric actuator, and containing any one or both of at least one metal element selected from the group made of chromium, titanium, aluminum, tantalum, hafnium, and iridium, and silicon nitride, as a constituent element, and
      a third layer disposed between the second layer and the piezoelectric actuator and containing zirconium as a constituent element, and
      a fourth layer is provided, and the fourth layer containing any one or both of at least one metal element selected from the group made of chromium, titanium, aluminum, tantalum, hafnium, and iridium, and silicon nitride, as a constituent element, on the third layer on a piezoelectric actuator side,
      the fourth layer being disposed between the second electrode and the piezoelectric layer when viewed in a direction orthogonal to the first direction.

2. The piezoelectric device according to claim 1, wherein the first electrode and the piezoelectric layer are interposed between the third layer and the fourth layer from a third layer side.

3. The piezoelectric device according to claim 1, wherein in a plan view in a direction opposite to the first direction, the recessed portion is covered with the second layer and the fourth layer.

4. The piezoelectric device according to claim 1, wherein the second layer and the fourth layer have the same material as each other.

5. The piezoelectric device according to claim 1, wherein a thickness of the second layer is thicker than that of the fourth layer.

6. The piezoelectric device according to claim 1, wherein the second layer and the third layer have different valences from each other.

7. The piezoelectric device according to claim 1, wherein the second layer and the third layer have the same valence as each other.

8. The piezoelectric device according to claim 1, wherein the second layer contains at least one of chromium oxide, titanium oxide, and aluminum oxide.

9. The piezoelectric device according to claim 8, wherein the fourth layer contains at least one of chromium oxide, titanium oxide, and aluminum oxide.

10. The piezoelectric device according to claim 9, wherein the chromium oxide contained in the fourth layer has an amorphous structure.

11. The piezoelectric device according to claim 9, wherein the titanium oxide contained in the fourth layer has a rutile structure.

12. The piezoelectric device according to claim 9, wherein the aluminum oxide contained in the fourth layer has an amorphous structure or a trigonal crystal system structure.

13. The piezoelectric device according to claim 1, wherein a thickness of the second layer is thinner than a thickness of each of the first layer and the third layer.

14. The piezoelectric device according to claim 1, wherein a thickness of the second layer is in a range of 20 nm or more and 50 nm or less.

15. The piezoelectric device according to claim 1, wherein the diaphragm further includes a fifth layer provided between the first layer and the second layer, and containing an element contained in the second layer and silicon as a constituent element.

16. The piezoelectric device according to claim 15, wherein the second layer further contains silicon as a constituent element, and a silicon content in the fifth layer is higher than a silicon content in the second layer.

17. The piezoelectric device according to claim 1, wherein the diaphragm further includes a sixth layer disposed between the second layer and the third layer, and containing an element contained in the second layer and silicon as a constituent element.

18. The piezoelectric device according to claim 1, wherein an impurity content in the second layer is higher than an impurity content in the third layer.

19. A liquid ejecting head comprising:
    the piezoelectric device according to claim 1, wherein
    the piezoelectric actuator,
    the diaphragm that vibrates by driving the piezoelectric actuator, and
    a flow path formation substrate provided with a pressure chamber that applies pressure to a liquid by a vibration of the diaphragm
    are laminated in a first direction in an order of the flow path formation substrate, the diaphragm, and the piezoelectric actuator.

* * * * *